(12) United States Patent
Siebrits et al.

(10) Patent No.: US 7,386,431 B2
(45) Date of Patent: Jun. 10, 2008

(54) METHOD SYSTEM AND PROGRAM STORAGE DEVICE FOR SIMULATING INTERFACIAL SLIP IN A HYDRAULIC FRACTURING SIMULATOR SOFTWARE

(75) Inventors: Eduard Siebrits, Stafford, TX (US); Anthony Peirce, Vancouver (CA)

(73) Assignee: Schlumberger Technology Corporation, Sugar Land, TX (US)

( * ) Notice: Subject to any disclaimer, the term of this patent is extended or adjusted under 35 U.S.C. 154(b) by 497 days.

(21) Appl. No.: 11/096,047

(22) Filed: Mar. 31, 2005

(65) Prior Publication Data
US 2006/0224370 A1    Oct. 5, 2006

(51) Int. Cl.
*G06G 7/48* (2006.01)
*G06F 7/60* (2006.01)
*G06F 17/10* (2006.01)
*G06F 19/00* (2006.01)

(52) U.S. Cl. .............................. 703/10; 703/2; 702/11; 702/12; 702/13; 702/14

(58) Field of Classification Search ................. 703/10, 703/2; 702/11–14
See application file for complete search history.

(56) References Cited

U.S. PATENT DOCUMENTS 6,985,816 B2 * 1/2006 Sorrells et al. ............... 702/14
2004/0254730 A1    12/2004 Najmuddin

OTHER PUBLICATIONS

Pichmony Anhaouy, "Numerical Solution of a Fluid Driven Fracture Problem" Institute of Applied Mathematics, The University of British Columbia, Vancouver, British Columbia, Canada, Apr. 22, 2003, pp. 1-60.*

Anthony P. P,eirce, Eduard Siebrits, "Uniform asymptotic approximations for accurate modeling of cracks in layered elastic media" International Journal of Fracture, Jan. 31, 2001, pp. 205-239.*

A. Peirce, E. Seibrits "Stability Analysis and Design of Time Stepping Schemes for General Elastodynamic Boundary Element Models", International Journal for Numerical Methods in Engineering, vol. 40, pp. 319-342 (1997).*

Gohfer *Grid Oriented Hydraulic Fracture Extension Replicator*, p. 1-52, Appendix, p. 1-11, (1996) by Stim-Lab, Inc. and Marathon Oil Company.

(Continued)

*Primary Examiner*—Zoila E. Cabrera
*Assistant Examiner*—Dwin M Craig
(74) *Attorney, Agent, or Firm*—Thomas O. Mitchell; David Cate; Robin Nava

(57) ABSTRACT

A method, practiced by a Hydraulic Fracturing Simulator software, is adapted for simulating a hydraulic fracture in an Earth formation, the formation including a plurality of layers, a slip zone, which represents a debonding between adjacent layers of the Earth formation, possibly existing between the adjacent layers, the method comprising the step of: setting up an Influence Coefficient Matrix, the matrix having a plurality of numbers, the plurality of numbers of the Influence Coefficient Matrix being calculated and determined such that the method, practiced by the Hydraulic Fracturing Simulator software for simulating the hydraulic fracture, will model, or take into account an existence of, the slip zone and/or the debonding between the adjacent layers of the Earth formation.

34 Claims, 13 Drawing Sheets

OTHER PUBLICATIONS

Cade Office, *Solution Revolution Break Open Your Reserves with FracCADE*, p. 1-6, (Jan. 1998), Schlumberger Oilfield Services, Dowell, GeoQuest.

J. A. Ryder and J. A. L. Napier, *Error Analysis and Design of a Large-Scale Tabular Mining Stress Analyser*, (1985) Chamber of Mines of South Africa Research Organization.

D. A. Mendelsohn, *A Review of Hydraulic Fracture Modeling—Part I: General Concepts, 2D Models, Motivation for 3D Modeling*, p. 369-376, (Sep. 1984), Journal of Energy Resources Technology.

L. J. Wardle, *Stress Analysis of Multilayered Anisotropic Elastic Systems Subject to Rectangular Loads*, p. 1-37, (1980) CSIRO.

Sarva Jit Singh, *Static Deformation of a Transversely Isotropic Multilayerd Half-Space by Surface Loads*, p. 263-273, (1986), Physics of the Earth and Planetary Interiors, 42.

Sarva Jit Singh, *Static Deformation of a Multilayered Half-Space by Internal Sources*p. 3257-3263. (Jun. 10, 1970), Journal of Geophysical Research.

Ryosuke Sato and Mitsuhiro Matsu'ural, *Static Deformations Due to the Fault Spreading over Several Layers in a Multi-Layered Medium Part I: Displacement*, p. 227-249, (Sep. 20, 1973), J. Phys. Earth, 21.

Ernian Pan, *Static Green's Function in Multilayeres Halfspaces*, p. 509-521, (1997), Appl. Math. Modeling, vol. 21.

Ernian Pan, *Static Response of a Transversely Isotropic and Layered Half-Space to General Dislocation Sources*, p. 103-115, (1989), Physics of the Earth and Planetary Interiors, 58.

Ernian Pan, *Stastic Response of a Transversely Isotropic and Layered Half-Space to General Surface Loads*, p. 353-363, Physics of the Earth and Planetary Interiors, 54, 1989.

A. A. Linkova and A. A. Savitski, *An Effective Method for Multi-layered Media with Cracks and Cavities*, p. 338-355, (1994) International Journal of Damage Mechanics, vol. 3.

Dushan B. Jovanovic, Moujahed I. Husseini and Michael A. Chinnery, *Elastic Dislocations in a Layered Half-Space—I. Basic Theory and Numerical Methods*, p. 205-217, (1974), Geophys. J. R. astr. Soc. 39.

Raymond Crampagne, Majid Ahmadpanah, and Jean-Louis Guiraud, *A Simple Method for Determining the Green's Function for a Large Class of MIC Lines Having Multilayered Dielectric Structures*, p. 82-87 (1978) IEEE.

Y. Leonard Chow, Jian Jun Yang, and Gregory E. Howard, *Complex Images for Electrostatic Field Computation in Multilayered Media*, P. 1120-1125, (1991) IEEE.

W. T. Chen, *Computation of Stresses and Displacements in a Layered Elastic Medium*, p. 775-800 (1971) Int. J. Engng Sci. vol. 9.

J.A. Ryder, *Optimal iteration schemes suitable for general non-linear boundary element modeling applications*, pp. 1079-1084, (1991), Rock Engineering Division, COMRO, South Africa.

Ben-Menahem, A. and Singh, S.J. 1968. Multipolar Elastic Fields In A Layered Half Space, Bull. Seism. Soc. Am. 58(5). 1,519-72.

Singh, S.J. 1970. Static Deformation Of A Multi-Layered Half-Space By Internal Sources. J. Geophys. Res. 75(17). 3,257-63.

Chen. W.T. 1971. Computation Of Stresses And Displacements In A Layered Elastic Medium. Int.J. Engng Sci. vol. 9. 775-800.

Sato, R. and Matsu'ura, M. 1973. Static Deformations Due To The Fault Spreading Over Several Layers In A Multi- Layered Medium Part I: Displacement. J.Phys. Earth. 21.

Jovanovich, D.B. Husseini, M.I. and Chinnery, M.A. 1974. Elastic Dislocations In A Layered Half-Space—I. Basic Theory And Numerical Methods. Geophys. J.R., Astro. Soc. 39.205-217.

Wardle, L.J. 1980. Stress Anaylsis Of Multilayered Anisotropic Elastic Systems Subject To Rectangular Loads, CSIRO Aust. Div. Appl. Geomech. Tech. paper No. 33. 1-37.

Singh, S.J. 1986. Static Deformations Of A Transversely Isotropic Multilayered Half-Space By Surface Loads. Physics of the Earth and Planetary Interiors. 42. 263-273.

Pan, E. 1989, Static Response Of A transversely Isotropic And Layered Half-Space To General Surface Loads. Physics of the Earth and Planetary Interiors. 54. 353-363.

Pan E. 1989. Static Response Of A Transversely Isotropic And Layered Half-Space To General Dislocation Sources. Physics of the Earth and Planetary Interiors, 58. 103-117.

Pan, E. 1997. Static Green's Functions In Multilayered Half Spaces. Appl. Math. Modeling. 21, 509-521.

Chow, Y.L., Yang, J.J. and Howard, G.E. 1991. Complex Images For Electrostatic Computation In Multilayered Media. IEEE Trans. On Microwave Theory and Techniques. vol. 39.No. 7. 1120-25.

Crampagne, R. Ahmadpanah, M and Guiraud, J.L. 1978. A Simple Method For Determining The Green's Function For A Class Of MIC Lines Having Multilayered Dielectric Structures. IEEE Trans. On Microwave Theory and Techniques. vol. MTT-26.No. 2. 82-87.

Linkov,A.M. Linkova, A.A. and Savitski, A.A. 1994. An Effective Method For Multi-layered Media With Cracks and Cavities. Int. J. of Damage Mech. 3. 338-35.

Ryder, J.A. and Napier, J.A. L. 1985. Error Analysis and Design Of A Large Scale Tabular Mining Stress Analyzer. Proc: Fifth Int. Conf. On Num. Meth. In Geomech. Nagoya. 1549-1555.

J.A. Ryder, Cairns, E.G. Beer, J.R. Booker, and J.P. Carter, Optimal Iteration Schemes Suitable For General Non-Linear Boundary Element Modeling Applications: Proceedings for the 7th International Conference on Computer Methods and Advances in Geomechanics, Balkema Rotterdam, 1991.

P. Peirce, and E. Siebrits, "Uniform Asymptotic Approximations For Accurate Modeling of Cracks in Layered Elastic Media", International Journal of Fracture, 110, 205-239-, 2001.

Salamon M., "Some Application of the Frictionless Laminated Model". Rock Mechanics as a Guide for Efficient Utilization of Natural Resources, Khair (ed.), copyright 1989, Balkema, Rotterdam, ISBN 90 6191 871 5.

Salamon M., "Subsidence Prediction Using a Laminated Linear Model", Rock Mechanics as a Guide for Efficient Utilization of Natural Resources, Khair (ed.), copyright 1989, Balkema Rotterdam, ISBN 90 6191 8715.

Yue, Z. and Yin J., "Backward Transfer-Matrix Method for Elastic Analysis of Layered Solids with Imperfect Bonding", Journal of Elasticity, 50: 109-128, 1998 copyright 1998 Kluwer Academic Publishers.

Dr. Quan Guo, A Fully Three-Dimensional Hydraulic Fracturing Simulator, p. 1-14, TerraFrac (Jan. 1, 1995).

FracCade Software, p. 1-4, Schlumberger Dowell, (Jan 1, 1995).

R.J. Clifton, Three-Dimensional Fracture-Propagation Models, p. 95-108, Brown U. and Terra Tek Inc. (Jan. 1, 1989).

* cited by examiner

OTHER DATA

LAYER CONFINING STRESSES AND PROPERTIES
PERFORATING INTERVAL AND DEPTH
WELLBORE DATA
FLUID AND PROPPANT PROPERTIES
TIME HISTORY OF FLUID VOLUMES TO BE PUMPED
TIME HISTORY OF PROPPANT VOLUMES TO BE PUMPED
LOGS IDENTIFYING IDENTITY, PROPERTIES, AND LOCATION OF GEOLOGICAL ZONES

MULTI-LAYER ELASTICITY EQUATION: $\{w\} = [C]^{-1}\{p-\sigma_c\}$

[C] = INFLUENCE COEFFICIENT MATRIX

[C] = FULLY POPULATED WITH NUMBERS 43

CALCULATE [C] IN A SPECIAL MANNER (FIGS. 17 AND 18) TO INCLUDE THE EFFECT OF SLIP OR DEBONDING ALONG ANY OF THE LAYER INTERFACES

FIG. 14

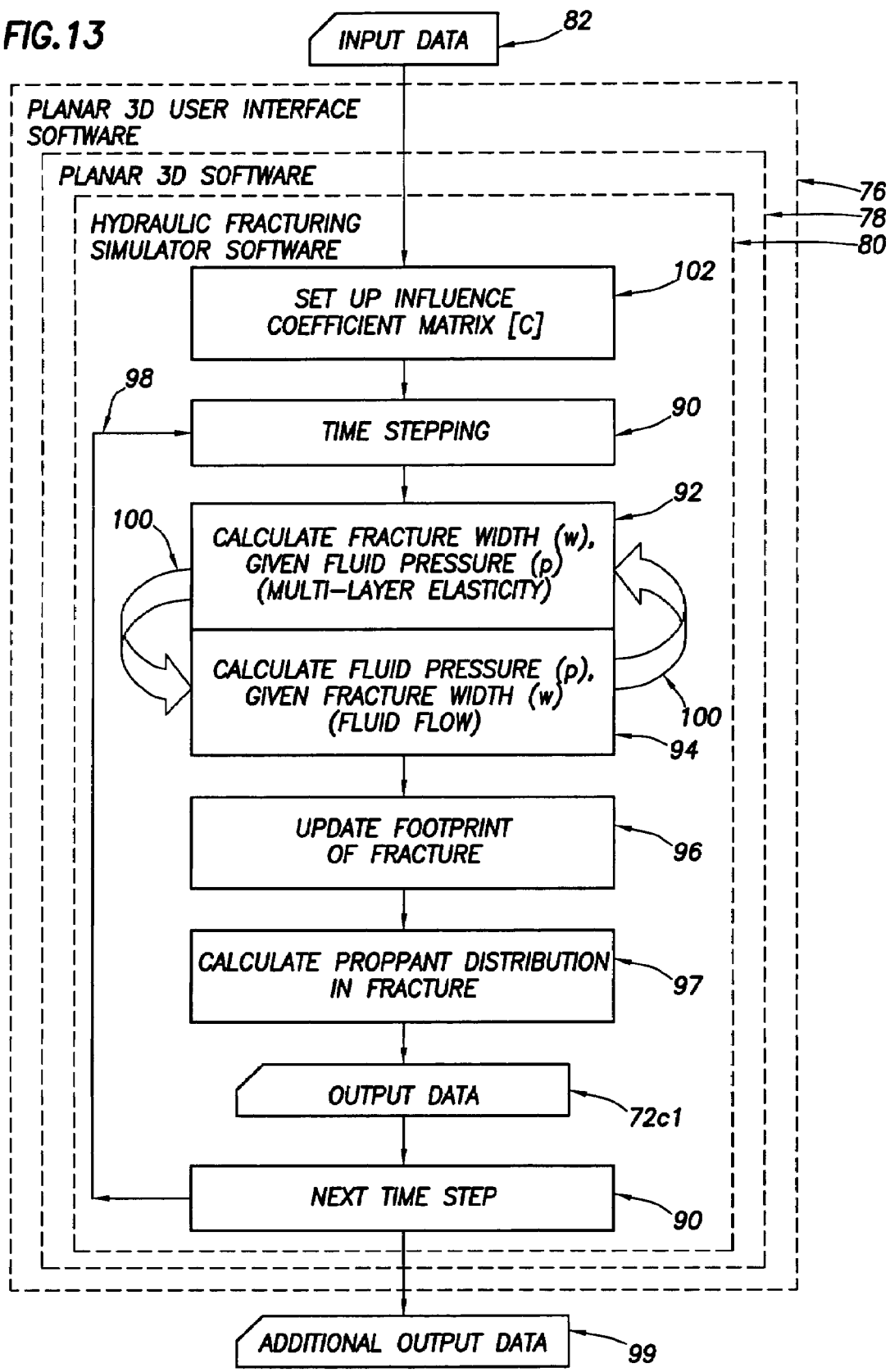

CALCULATE LAYER BENCHMARK STRESSES $\sigma_{zz}^l$ ($x(ixr=1:nelemx)$, $y(iyr=1:nelemy)$) THROUGHOUT THE PARENT MESH BY MEANS OF THE FOLLOWING STEPS:

53a — SOLVE EQ. (8) FOR $\hat{\sigma}_{yy}^l$, $\hat{\sigma}_{yx}^l$, $\hat{\sigma}_{yz}^l$ DUE TO THE CURRENT SENDING ELEMENT TO YIELD THE FOURIER TRANSFORM (FT) OF THE INTERFACE STRESSES-DISPLACEMENT VECTORS $\hat{T}^l(k,y)$. USE (4) TO CALCULATE $\hat{u}_y^l$, $\hat{u}_x^l$, $\hat{u}_z^l$ AND THUS FORM THE VECTOR $\hat{T}^l(k,y)$ IN (3). USE (3) TO DETERMINE THE LAYER SPECTRAL COEFFICIENTS $A_j^l(k)$, AND DETERMINE THE NORMAL STRESS COMPONENT $\hat{\sigma}_{zz}^l$ IN THE FRACTURE PLANE FROM:

$$\hat{\sigma}_{zz}^l(m,n,y) = \sum_p A_p^l(k) c_p^l(m,n,y) e^{\epsilon_p k y}$$

WHERE $c_p^l(m,n,y)$ DEPEND ON THE LAYER ELASTIC MODULI AND $\epsilon_p = \pm 1$

53b — · DETERMINE A 3-LAYER AND 2-INTERFACE UNIFORM ASYMPTOTIC SOLUTION (UAS) $(\hat{\sigma}_{zz}^l)^{UAS}$ THAT CONTAINS THE HIGH FREQUENCY COMPONENTS:

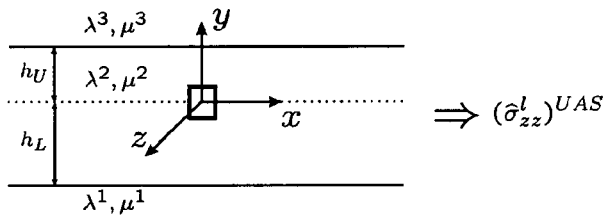

· DETERMINE THE LOW FREQUENCY COMPONENTS (LOW) BY SUBTRACTING THE (UAS) FROM $\hat{\sigma}_{zz}^l$ :

$$(\hat{\sigma}_{zz}^l)^{LOW} = \hat{\sigma}_{zz}^l - (\hat{\sigma}_{zz}^l)^{UAS} \quad \text{—— 53b1}$$

53c — · INVERT THE UAS SOLUTION ANALYTICALLY:

$$(\sigma_{zz}^l(x,y,z))^{UAS} = \frac{1}{(2\pi)^2} \int_{-\infty}^{\infty} \int_{-\infty}^{\infty} e^{-i(mx+nz)} (\hat{\sigma}_{zz}^l(m,n,y))^{UAS} dm\, dn$$

53d — · INVERT THE LOW FREQUENCY FT COMPONENTS $\hat{\sigma}_{zz}^{LOW}$ NUMERICALLY:

$$(\sigma_{zz}^l(x,y,z))^{LOW} = \frac{1}{(2\pi)^2} \int_{-\infty}^{\infty} \int_{-\infty}^{\infty} e^{-i(mx+nz)} (\hat{\sigma}_{zz}^l(m,n,y))^{LOW} dm\, dn$$

53e — · COMBINE THE LOW FREQUENCY STRESSES AND THE UAS STRESSES TO GET THE STRESSES DUE TO THE CURRENT SENDING ELEMENT $$\sigma_{zz}^l = (\sigma_{zz}^l)^{LOW} + (\sigma_{zz}^l)^{UAS} \quad \text{——53e1}$$

*FIG. 18*

METHOD SYSTEM AND PROGRAM STORAGE DEVICE FOR SIMULATING INTERFACIAL SLIP IN A HYDRAULIC FRACTURING SIMULATOR SOFTWARE

CROSS REFERENCE TO RELATED APPLICATION

This application is related to a copending application corresponding to Ser. No. 11/095,104 entitled "Method System and Program Storage Device for Simulating a Multilayer Reservoir and Partially Active Elements in a Hydraulic Fracturing Simulator" having the same inventors and the same assignee as the present application.

BACKGROUND

The subject matter set forth in this specification relates to a Hydraulic Fracturing Simulator Software adapted for designing and monitoring and evaluating petroleum reservoir fracturing, and, in particular, to a Hydraulic Fracturing Simulator Software adapted for simulating a phenomenon known as 'slip' or 'debonding' between adjacent layers of an Earth formation when designing and monitoring and evaluating petroleum reservoir fracturing.

In hydraulic fracturing, thousands of gallons of fluid are forced under high pressure underground to split open the rock in a subterranean formation, a process that is known as 'petroleum reservoir fracturing' associated with 'a fracturing event'. Proppant or propping agent is carried into the fracture by a viscosified fluid, and deposited into the fracture. Proppant provides a permeable flow channel for formation fluids, such as oil and gas, to travel up the wellbore and to the Earth's surface. Fracturing involves many variables, including: viscosity of the fracturing fluid, rate of leak-off of fracturing fluid into the reservoir, proppant carrying capacity of the fluid, viscosity of the fluid as a function of temperature, time history of fluid volumes (i.e., the amount of fluid pumped over a given period of time), time history of proppant volumes, fluid physical constants, proppant properties, and the geological properties of various zones in the reservoir.

A Hydraulic Fracturing Simulator software is capable of modeling the 'fracturing event'. In fact, the Hydraulic Fracturing Simulator software will design and monitor and evaluate the 'petroleum reservoir fracturing' associated with the 'fracturing event' from a time extending before, during, and after the 'fracturing event'. However, when the Hydraulic Fracturing Simulator software designs and monitors and evaluates the 'petroleum reservoir fracturing' associated with the 'fracturing event', the Hydraulic Fracturing Simulator software should also function to model a phenomenon known as 'interfacial slip' or 'debonding'. 'Interfacial slip' or 'debonding' between adjacent layers of an Earth formation will often exist during a 'fracturing event', and the 'Hydraulic Fracturing Simulator software' should model the 'interfacial slip' or 'debonding' that takes place during the 'fracturing event'.

Therefore, a Hydraulic Fracturing Simulator Software is needed that is capable of modeling or simulating the 'interfacial slip' or 'debonding' which exists between adjacent layers of an Earth formation when the Hydraulic Fracturing Simulator Software is designing and monitoring and evaluating 'petroleum reservoir fracturing' associated with a 'fracturing event'.

SUMMARY

One aspect of the present invention involves a method of simulating a hydraulic fracture in a formation having a plurality of layers where slip exists between at least one adjacent pair of the layers, comprising: (a) calculating an influence coefficient matrix on the condition that the slip exists between at least one adjacent pair of the layers, the calculation of said matrix taking into account an existence of said slip; (b) calculating a fracture width at a first time step using the influence coefficient matrix; (c) calculating a fluid pressure at the first time step using the fracture width; and (d) updating a fracture footprint in response to the calculating step (c).

Another aspect of the present invention involves a program storage device readable by a machine tangibly embodying a program of instructions executable by the machine to perform method steps for simulating a hydraulic fracture in a formation having a plurality of layers where slip exists between at least one adjacent pair of the layers, the method steps comprising: (a) calculating an influence coefficient matrix on the condition that the slip exists between at least one adjacent pair of the layers, the calculation of said matrix taking into account an existence of said slip; (b) calculating a fracture width at a first time step using the influence coefficient matrix; (c) calculating a fluid pressure at the first time step using the fracture width; and (d) updating a fracture footprint in response to the calculating step (c).

Another aspect of the present invention involves a system adapted for simulating a hydraulic fracture in a formation having a plurality of layers where slip exists between at least one adjacent pair of the layers, comprising: first apparatus adapted for calculating an influence coefficient matrix on the condition that the slip exists between at least one adjacent pair of the layers, the calculation of said matrix taking into account an existence of said slip; second apparatus adapted for calculating a fracture width at a first time step using the influence coefficient matrix; third apparatus adapted for calculating a fluid pressure at the first time step using the fracture width; and fourth apparatus adapted for updating a fracture footprint in response to the calculation performed by the third apparatus.

Another aspect of the present invention involves a program storage device readable by a machine tangibly embodying a program of instructions executable by the machine to perform method steps of simulating a hydraulic fracture in an Earth formation where the formation includes a multilayered reservoir comprised of a plurality of layers, a slip existing between at least one adjacent pair of layers of the multilayered reservoir, the method steps comprising: setting up an influence coefficient matrix, the matrix having a plurality of numbers, the plurality of numbers of the influence coefficient matrix being calculated and determined such that the method steps for simulating the hydraulic fracture will take into account an existence of the slip between at least one adjacent pair of the layers of the multilayered reservoir.

Another aspect of the present invention involves a method of simulating a hydraulic fracture in an Earth formation where the formation includes a multilayered reservoir comprised of a plurality of layers, a slip existing between at least one adjacent pair of layers of the multilayered reservoir, comprising the step of: setting up an influence coefficient matrix, the matrix having a plurality of numbers, the plurality of numbers of the influence coefficient matrix being calculated and determined such that the method for simulating the hydraulic fracture will take into account an existence of the slip between at least one adjacent pair of the layers of the multilayered reservoir.

Another aspect of the present invention involves a system adapted for simulating a hydraulic fracture in an Earth formation where the formation includes a multilayered reservoir comprised of a plurality of layers, a slip existing between at least one adjacent pair of layers of the multilayered reservoir, comprising: apparatus adapted for setting up an influence coefficient matrix, the matrix having a plurality of numbers, the plurality of numbers of the influence coefficient matrix being calculated and determined such that the method for simulating the hydraulic fracture will take into account an existence of the slip between at least one adjacent pair of the layers of the multilayered reservoir.

Further scope of applicability will become apparent from the detailed description presented hereinafter. It should be understood, however, that the detailed description and the specific examples, while representing a preferred embodiment, are given by way of illustration only, since various changes and modifications within the spirit and scope of the 'linear spring concept' as described and claimed in this specification will become obvious to one skilled in the art from a reading of the following detailed description.

BRIEF DESCRIPTION OF THE DRAWINGS

A full understanding will be obtained from the detailed description of the preferred embodiment presented hereinbelow, and the accompanying drawings, which are given by way of illustration only and are not intended to be limitative, and wherein:

FIG. 11 illustrates in greater detail the 'Other Data' of FIG. 10;

FIG. 13 illustrates a construction of the 'Hydraulic Fracturing Simulator software' of FIG. 10;

FIG. 14 illustrates the function practiced by the 'Set Up Influence Coefficient Matrix [C]' step in the 'Hydraulic Fracturing Simulator software' of FIG. 13;

FIGS. 17 and 18 illustrate a flowchart which illustrates a construction of the computation of the 'Influence Coefficient Matrix' in the 'Set Up Influence Coefficient Matrix' step of FIG. 13 and the 'Generate Elastic Influence Coefficient Matrix for Parent Mesh' step of FIG. 15.

DESCRIPTION

This specification discloses a Hydraulic Fracturing Simulator software adapted to be stored in a memory of a program storage device of a computer system for modeling and simulating an 'interfacial slip' or 'debonding' between adjacent layers of an Earth formation when the Hydraulic Fracturing Simulator software is designing and monitoring and evaluating petroleum reservoir fracturing. The Hydraulic Fracturing Simulator software includes a first step further including the step of 'Setting Up an Influence Coefficient Matrix' and a second step further including two iteration loops whereby, in a first iteration loop at a first time step, a second iteration loop will continuously calculate fracture width for each element of the mesh given a previously determined fluid pressure and will continuously calculate fluid pressure for each element of the mesh given a previously determined fracture width at which time the fracture footprint is updated to a first value, then, in the first iteration loop at a second time step, the second iteration loop continuously calculates fracture width for each element of the mesh given a previously determined fluid pressure and continuously calculates fluid pressure for each element of the mesh given a previously determined fracture width at which time the fracture footprint is updated to a second value, and the process repeats until the solution converges to a prescribed tolerance, at which point, Output Data is generated. The Output Data includes the previously determined first value of the fracture footprint, the previously determined second value of the fracture footprint, . . . , and the previously determined 'nth' value of the fracture footprint for additional time steps. The Output data, representative of the updated fracture footprint at each of the incremented time steps, is generated and is recorded or displayed on a recorder or display device.

Figure 4:
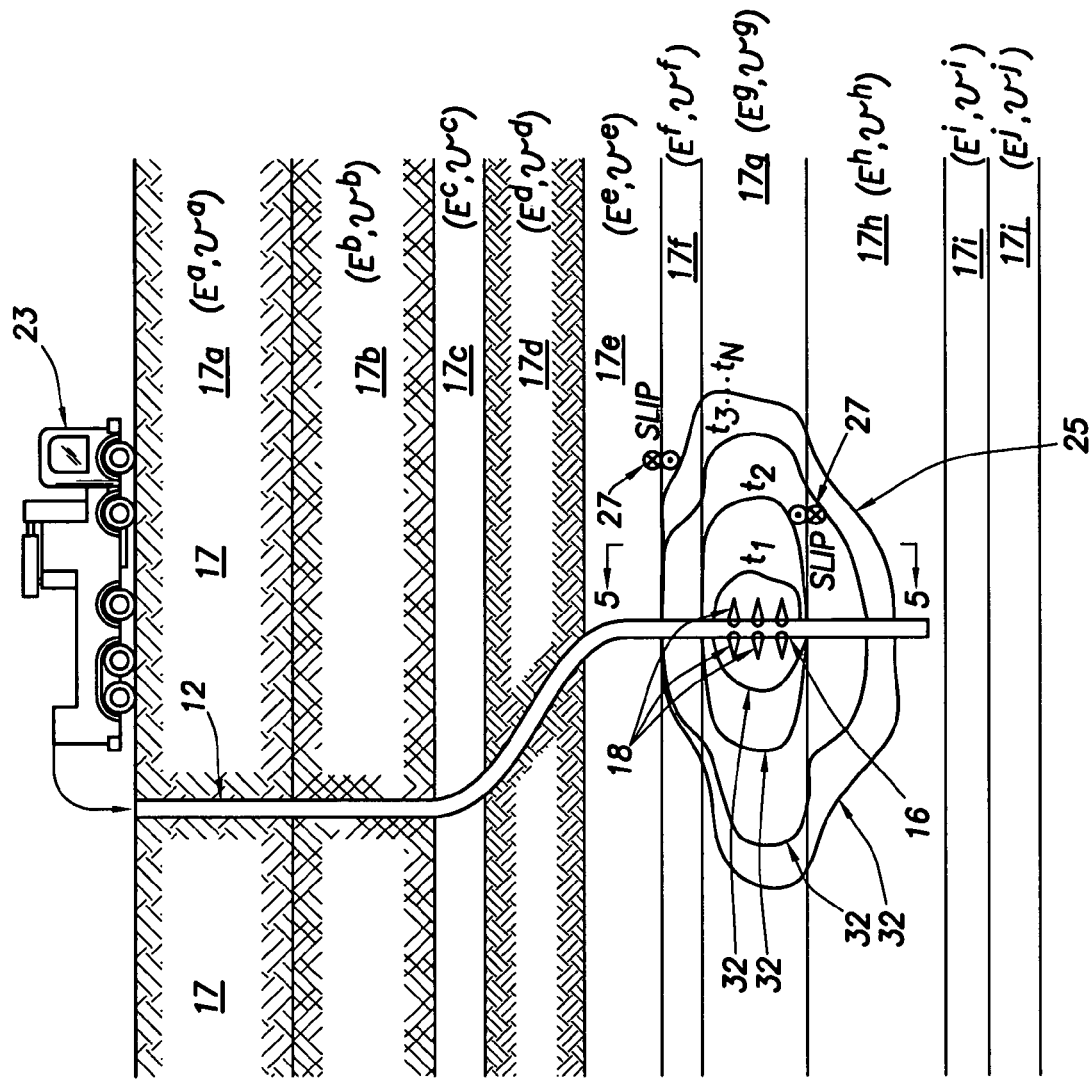
FIG. 4 illustrates a perforated wellbore in a multilayered Earth formation that is being fractured and showing the extent of the fracture, or fracture footprint, at times $t_1$, $t_2$, $t_3$, ..., $t_n$.
Figure 5:
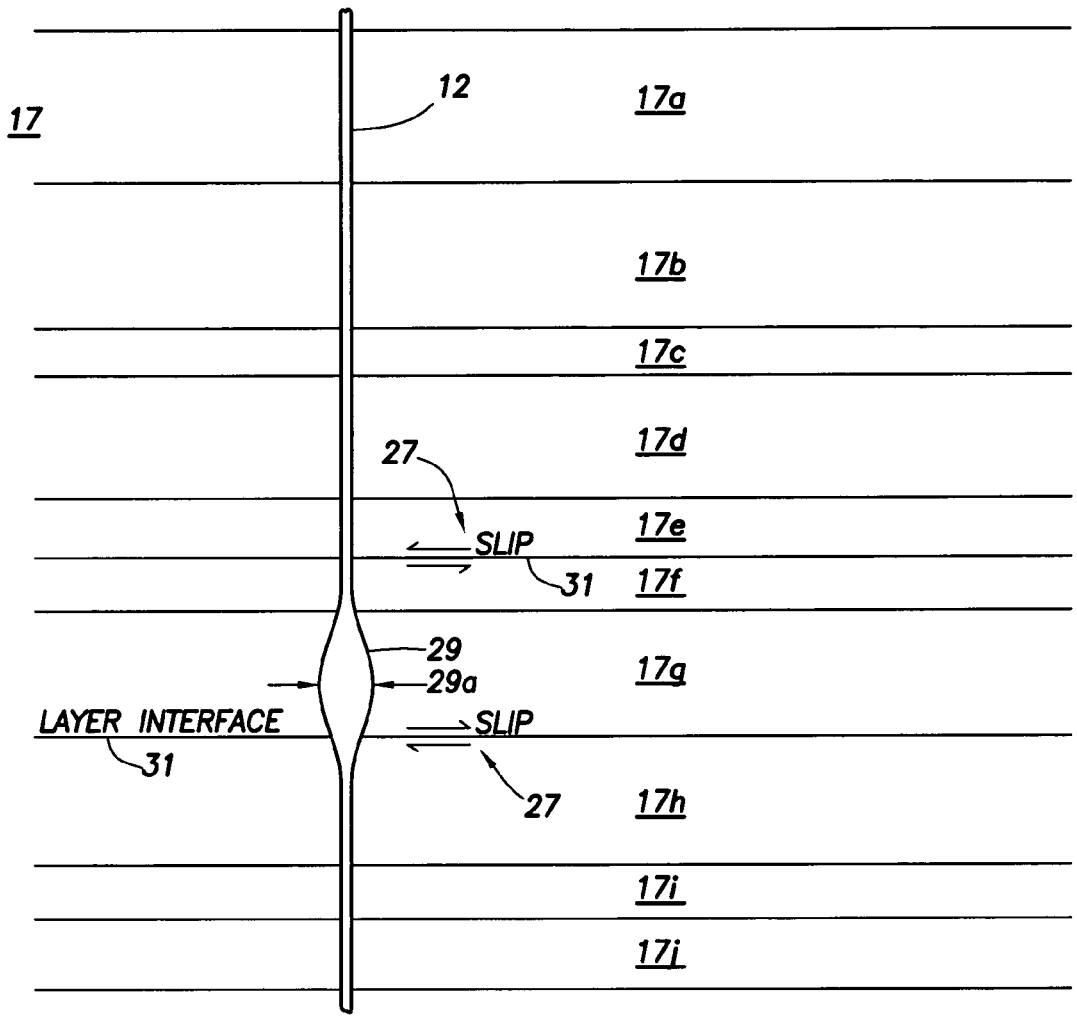
FIG. 5 illustrates the fracture shown at time $t_n$ in FIG. 4 which has been taken along section line 5-5 of FIG. 4.

In the first step including the step of 'Setting Up an Influence Coefficient Matrix', the Influence Coefficient Matrix is calculated and determined in a special way such that, when the Influence Coefficient Matrix is determined, and during any 'fracturing event', the Hydraulic Fracturing Simulator software will model and simulate the 'interfacial slip' or 'debonding' which takes place between adjacent layers of an Earth formation, as indicated in FIGS. 4 and 5.

Linear springs can be used to represent slip on layer interfaces in layered formations in an approximate manner. A rigorous approach would invoke a frictional law, such as Mohr-Coulomb, to model slip on interfaces. The aforementioned concept of linear springs (hereinafter, the 'linear spring concept') allows one to rigorously reduce computational effort at the expense of compromising on physical behavior. The 'linear spring concept' can be embedded in a variety of different algorithms that perform multi-layer elasticity calculations.

As a result, the 'linear spring concept' can be used in connection with multi-layer elasticity formulations adapted for use in Planar 3D hydraulic fracturing simulators. A corresponding method, involving the 'linear spring concept' in connection with multi-layer elasticity formulations in Planar 3D hydraulic fracturing simulators, would model interfacial slip (or debonding) in layered reservoirs adapted for use in hydraulic fracturing simulators. The 'linear spring concept' can be used to model interfacial slip (or debonding) when based on a mathematical framework involving a boundary element method scheme in a multi-layered elasticity solution.

Accordingly, in this specification, a method and system and program storage device is disclosed which is adapted for modeling interfacial slip in layered reservoirs by calculating an Influence Coefficient Matrix [C] in a 'special way', the calculation of the 'Influence Coefficient Matrix [C]' in the 'special way' using a 'linear springs' concept adapted for use in hydraulic fracturing simulators. The 'linear springs' concept is used to model interfacial slip based on a mathematical framework involving a boundary element method scheme in a multi-layered elasticity solution.

Figure 1:
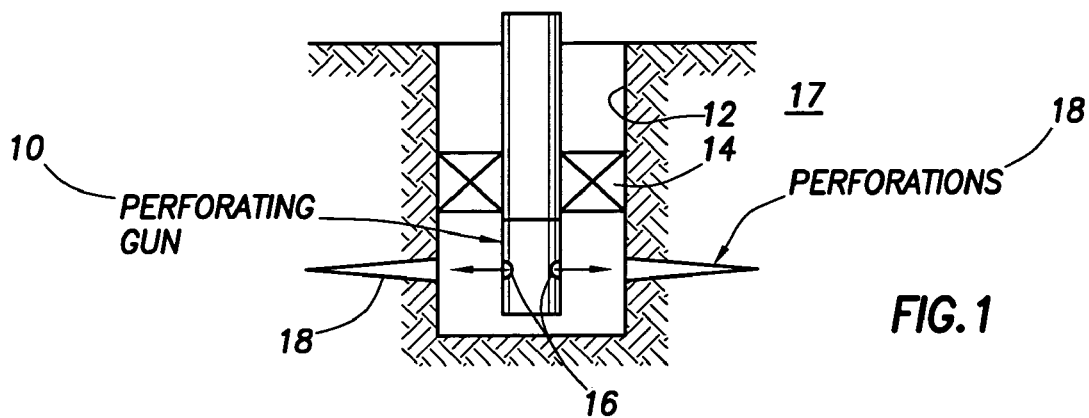
FIGS. 1 through 3 illustrate a typical Hydraulic Fracturing (HF) job in a wellbore.

Referring to FIG. 1, a perforating gun 10 is disposed in a wellbore 12 and a packer 14 isolates a plurality of shaped charges 16 of the perforating gun 10 downhole in relation to the environment uphole. The shaped charges 16 detonate and a corresponding plurality of perforations 18 are produced in a formation 17 penetrated by the wellbore 12.

Figure 2:
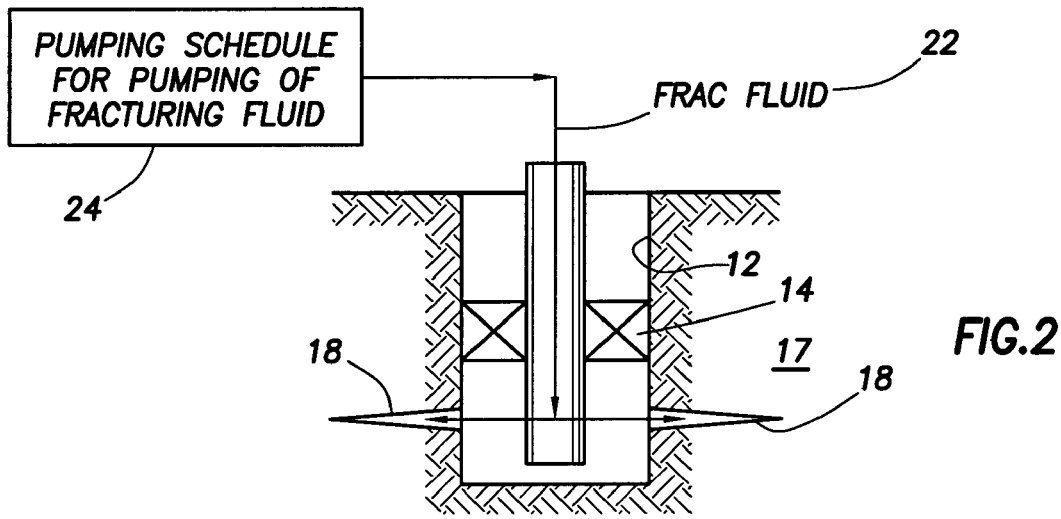

Referring to FIG. 2, after the formation 17 is perforated, a fracturing fluid 22 is pumped downhole into the perforations 18 in accordance with a particular pumping schedule 24. In response thereto, the formation 17 surrounding the perforations 18 is fractured.

Figure 3:
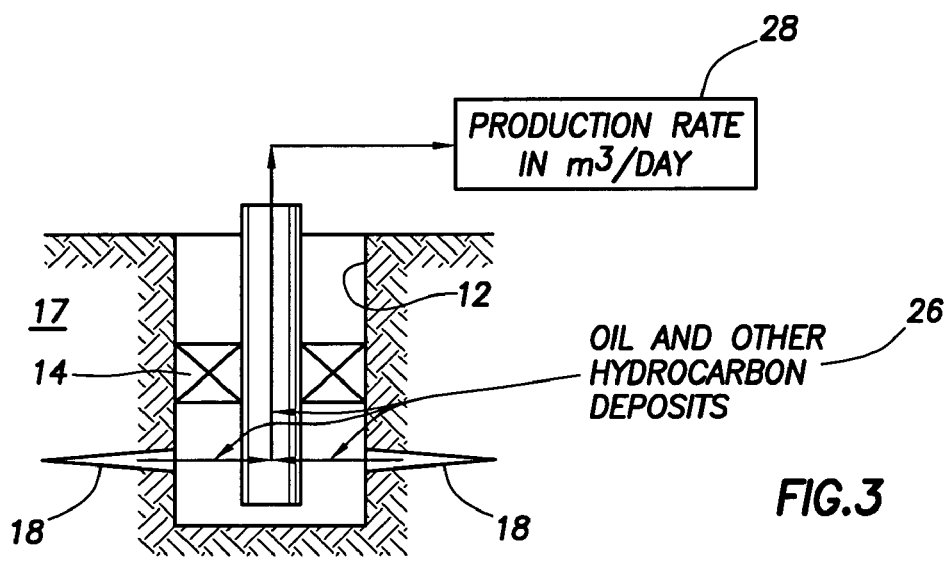

Referring to FIG. 3, after the formation 17 surrounding the perforations 18 is fractured, oil or other hydrocarbon deposits 26 begin to flow from the fractures, into the perforations 18, into the wellbore 12, and uphole to the surface. The oil or other hydrocarbon deposits flow at a certain 'production rate' 28 (e.g., in m$^3$/day).

Referring to FIG. 4, a perforated wellbore 12 in a multi-layered, hydraulically fractured Earth formation 17 is illustrated. In FIG. 4, a tubing is disposed in the wellbore 12, and the formation 17 penetrated by the wellbore 12 is perforated by detonating a plurality of shaped charges 16 which are disposed in the tubing, as shown schematically in FIG. 4.

As a result, a plurality of perforations 18 is disposed in the formation 17. A pump truck 23 will fracture the Earth formation 17 penetrated by the wellbore by pumping a fracturing fluid (e.g. containing proppants) into the perforations 18. As a further result, in FIG. 4, the formation 17 will be fractured. In FIG. 4, schematic snapshots of one hydraulic fracture 32 shown at a series of time steps are depicted at times $t_1, t_2, t_3, \ldots, t_n$ as denoted by the 'Planar 3D hydraulic fracture model' 25 shown in FIG. 4. The formation 17 includes a plurality of layers 17a, 17b, 17c, 17d, 17e, 17f, 17g, 17h, 17i, and 17j. Each of the layers 17a-17j can be characterized by a Young's Modulus (E) and a Poisson's Ratio (v). The Young's Modulus (E) and the Poisson's Ratio (v) describe the elastic properties of each of the layers 17a-17j in FIG. 4. For example, the elastic properties of layer 17a can be characterized by Young's Modulus and Poisson's Ratio ($E^a$, $v^a$), the elastic properties of layer 17b being characterized by Young's Modulus and Poisson's Ratio ($E^b$, $v^b$), the elastic properties of layer 17c being characterized by Young's Modulus and Poisson's Ratio ($E^c$, $v^c$), the elastic properties of layer 17d being characterized by Young's Modulus and Poisson's Ratio ($E^d$, $V^d$), the elastic properties of layer 17e being characterized by Young's Modulus and Poisson's Ratio ($E^e$, $v^e$), the elastic properties of layer 17f being characterized by Young's Modulus and Poisson's Ratio ($E^f$, $v^f$), the elastic properties of layer 17g being characterized by Young's Modulus and Poisson's Ratio ($E^g$, $v^g$), the elastic properties of layer 17h being characterized by Young's Modulus and Poisson's Ratio ($E^h$, $v^h$), the elastic properties of layer 17i being characterized by Young's Modulus and Poisson's Ratio ($E^i$, $v^i$), and the elastic properties of layer 17j being characterized by Young's Modulus and Poisson's Ratio ($E^j$, $v^j$).

In FIG. 4, a 'slip' region 27, also known as a 'debonding' region 27, is schematically illustrated. When the fracture 32 at times $t_1, t_2, t_3, \ldots, t_n$ is pressurized by the fracturing fluid, the adjacent layers of the formation 17, such as adjacent layer 17f relative to layer 17e and adjacent layer 17h relative to 17g, may 'slip' or 'debond' relative to one another. As a result, the 'slip' 27 in FIG. 4 represents the degree to which the adjacent layers of the formation 17 (such as layers 17e and 17f) will slip relative to one another when the fracture at times $t_1, t_2, t_3, \ldots, t_n$ is pressurized by the fracturing fluid. In particular, when the hydraulic fracture shown at times $t_1, t_2, t_3, \ldots, t_n$ in FIG. 4 is created, stresses and strains are produced in the surrounding reservoir rock. As a result of these induced stresses and strains in the reservoir rock, a slip 27 may be induced at the interface between adjacent layers of the formation 17, such as between layers 17e and 17f of the formation 17, or between layers 17g and 17h of the formation 17, or between any other adjacent layers, as shown in FIG. 4. The two sections of rock may slide or 'slip' relative to one another, and/or even 'debond' relative to each other. The 'Hydraulic Fracturing Simulator Software' 80 of FIG. 10 will model this 'slip' or 'debonding' phenomenon because the 'Hydraulic Fracturing Simulator Software' 80 will allow the interfaces between the different layers 17a-17j to slip (see slip 27) relative to one another when the fracture 32 at times $t_1, t_2, t_3, \ldots, t_n$ is pressurized by the fracturing fluid. In particular, the 'Hydraulic Fracturing Simulator Software' 80 of FIG. 10 will calculate the degree of slip 27 which takes place between the adjacent layers 17a-17j of the formation 17, such as between adjacent layers 17e and 17f or between adjacent layers 17g and 17h.

Referring to FIG. 5, a cross section schematic of the Earth formation 17 of FIG. 4 taken along section line 5-5 of FIG. 4 is illustrated. In FIG. 5, the wellbore 12 penetrates the Earth formation 17 and a hydraulic fracture 29 is shown between layers 17e and 17h. The fracture 29 has a certain 'fracture width' 29a which was created in response to the pressurization of the formation 17 by the fracturing fluid. The fracture 29 has a fracture width 29a because the 'rock mass' surrounding layer 17g has been 'deformed'. In fact, since the fracture 29 produces a 'deformation' in the 'rock mass' thereby creating the fracture width 29a as shown in FIG. 5, any point within the formation 17 will feel a certain stress and strain and therefore any point within the formation 17 will exhibit some 'deformation' of the 'rock mass'. In particular, the 'deformations' of the 'rock mass' will be different at each point within the formation 17 of FIG. 5. Since the 'deformations' of the 'rock mass' are different at each point within the formation 17, some slip 27 may occur at the interfaces between adjacent layers of the formation 17, such as at the interfaces between layers 17e and 17f in FIG. 5. In fact, some debonding may also occur at the interfaces between adjacent layers, such as at the interfaces between adjacent layers 17e and 17f of FIG. 5. For example, in FIG. 5, at interface 31 between adjacent layers 17g and 17h, the reservoir rock at the interface faces of interface 31 can debond, or slip, relative to one another, as indicated at slip 27 in FIG. 5. As a result, fluid can propagate within the slip 27 at the interface 31. As the fracture 29 grows toward the slip 27, the slip 27 in FIG. 5 can: (1) stop the growth of the fracture 29, and (2) control the height of the fracture 29. Therefore, it is important to model the slip 27 of FIG. 5 and its effect on the fracture 29 of FIG. 5. The 'Hydraulic Fracturing Simulator Software' 80 of FIG. 10 will model the slip 27 and its effect on the fracture 29 in FIG. 5.

Figure 6:
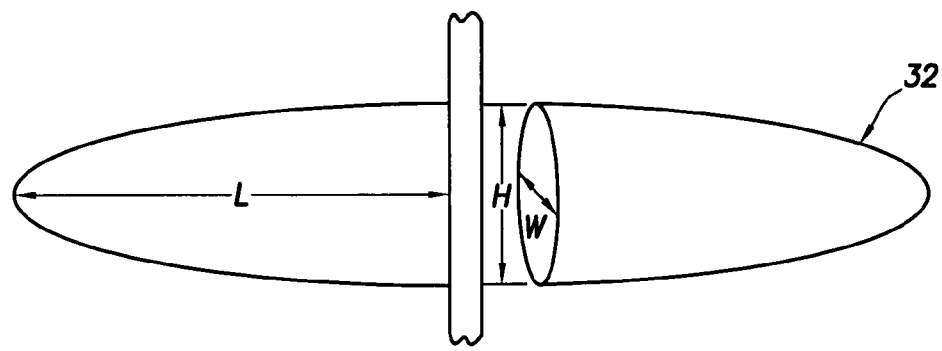
FIGS. 6 and 7 illustrate a fracture footprint created in the formation penetrated by the wellbore when the HF job is pumped.
Figure 7:
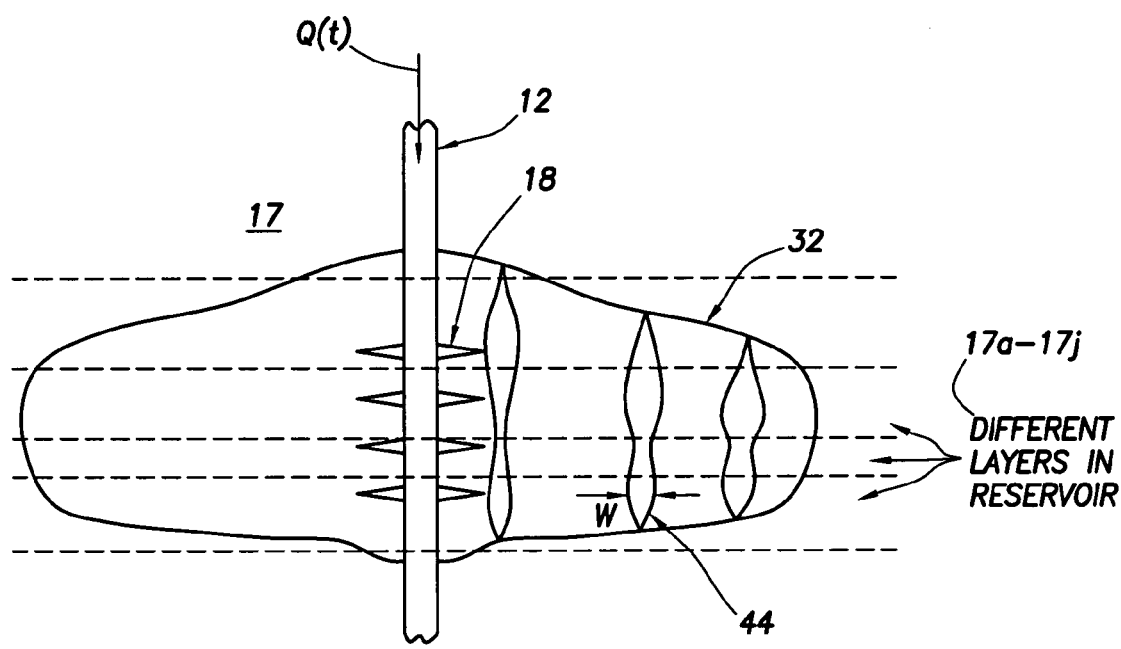

Referring to FIGS. 6 and 7, referring initially to FIG. 6, a simplified schematic three dimensional view of the fracture footprint 32 of FIG. 4, is illustrated. In FIG. 6, the fracture footprint 32 has a length 'L' and a height 'H' and a width 'w'. In FIG. 7, the wellbore 12 is illustrated again, and a plurality of perforations 18 are created in the formation 17 penetrated by the wellbore 12, as illustrated in FIGS. 1-3. The formation 17 includes a plurality of different layers 17a-17j. In FIG. 7, when the pump trucks 23 pump the fracturing fluid into the perforations 18, the 'fracture footprint' 32 is created in the formation 17 which is similar to the fracture footprint 32 shown in FIG. 4 that is created over the different periods of time $t_1, t_2, t_3, \ldots, t_n$. Note that the 'fracture footprint' 32 in FIG. 7 has a cross section 44, the cross section 44 having a fracture width 'w' similar to the width 'w' of the fracture footprint 32 shown in FIG. 6.

Figure 8:
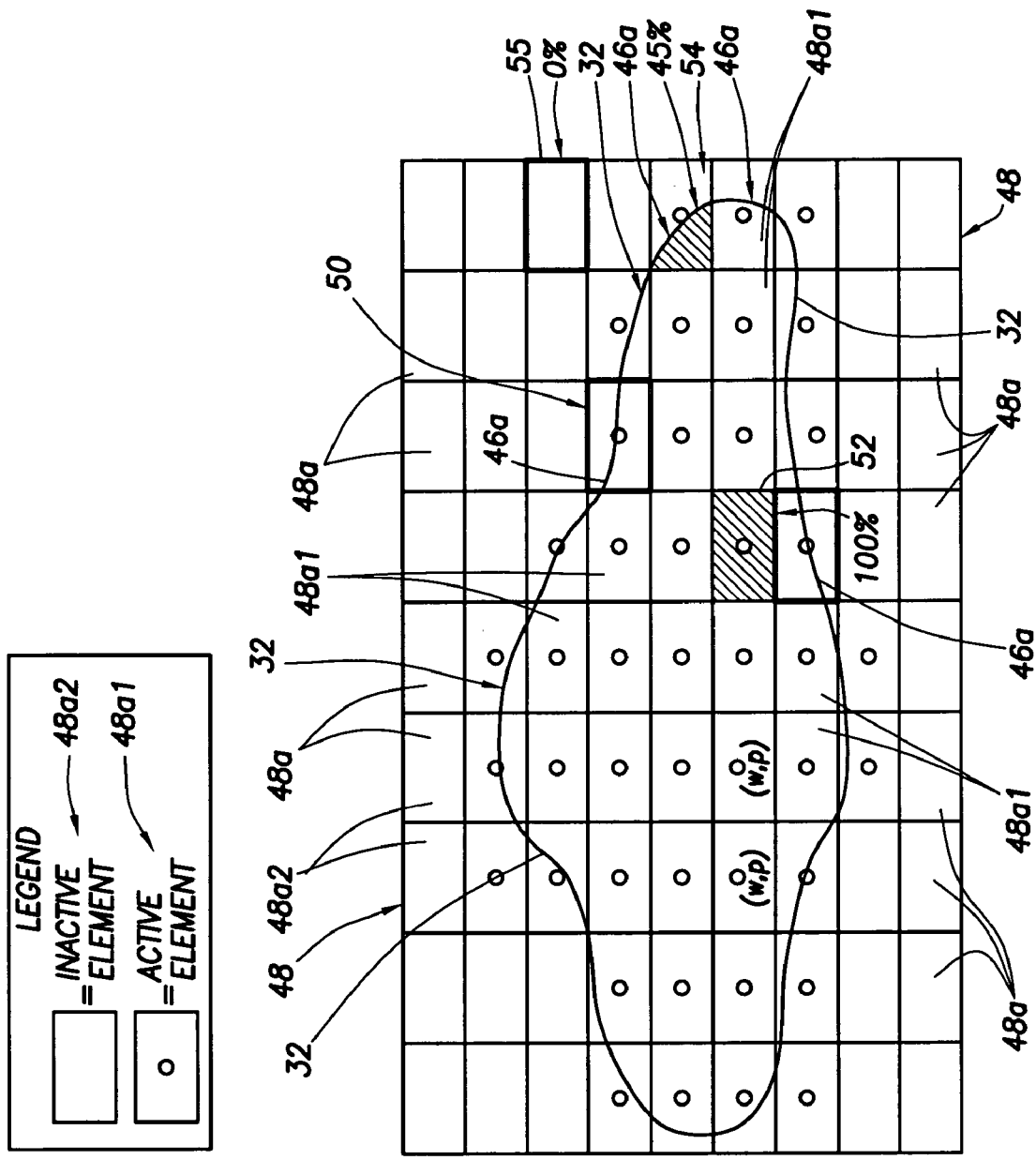
FIG. 8 illustrates how a numerical mesh comprised of a plurality of active and inactive grid cells or elements will overlay on top of the fracture footprint of FIG. 7, each grid cell of the mesh having a width and pressure, some of the grids cells called 'tip elements' being intersected by a perimeter of the fracture footprint, the tip elements having a width and a pressure (w, p), a portion of each tip element having fracturing fluid disposed therein.

Referring to FIG. 8, recalling the fracture footprint 32 shown in FIG. 7, in FIG. 8, a numerical mesh 48 comprised of a plurality of grid-elements 48a or grid cells 48a overlays over the top of the fracture footprint 32. The fracture footprint 32 is assumed (by the model of this specification) to lie in the 2D plane, although, in principle and in reality, the fracture footprint 32 does lie in the 3D plane. The mesh 48 includes a plurality of active elements or active grid cells 48a1 and a plurality of inactive elements or inactive grid cells 48a2. The active grid cells 48a1 will overlay the fracture footprint 32, whereas the inactive grid cells 48a2 will not overlay the fracture footprint 32. Each of the active grid elements or grid cells 48a1 of the mesh 48 has a width 'w' and a pressure 'p' assigned thereto, denoted by the symbol: (w, p). Therefore, each active grid cell 48a1 of the mesh 48 has a width/pressure value (w, p) assigned to that active grid cell. In FIG. 7, since the fracturing fluid propagating down the wellbore 12 enters the perforations 18 and creates the fracture footprint 32, in FIG. 8, each of the active grid cells 48a1 in the mesh 48 has a fracturing fluid disposed therein. In FIG. 8, there are two types of active grid cells 48a1: (1) an active grid cell 48a1 which is intersected by a perimeter 46a of the fracture footprint 32, and (2) an active grid cell 48a1 which is not intersected by the perimeter 46a of the fracture footprint 32. An active grid cell 48a1 that is intersected by the perimeter 46a of the fracture footprint 32 is known as a 'tip element'. For example, in FIG. 8, 'tip element' 50 is an active grid cell 48a1 that is intersected by the perimeter 46a of the fracture footprint 32. An active grid cell 48a1 which is not intersected by the perimeter 46a of the fracture footprint 32 has a volume which is wholly occupied by the fracturing fluid (i.e., 100% of the active grid cell is occupied by the fracturing fluid), where the fracturing 'fluid' may or may not include proppant. For example, in FIG. 8, active grid cell 52 is not intersected by the perimeter 46a of the fracture footprint 32 and its volume is wholly occupied by the fracturing fluid (100% of the volume of the active grid cell 52 is occupied by fracturing fluid). However, an active grid cell 48a1 that is intersected by the perimeter 46a (i.e., a 'tip element') is occupied by 'less than 100%' of the fracturing fluid. For example, the active grid cell or 'tip element' 54 is intersected by the perimeter 46a of the fracture footprint 32, however, only 45% of the pore volume of the active grid cell 54 is occupied by the fracturing fluid. In comparison, an inactive grid cell 48a2, such as inactive grid cell 55, has a volume which is wholly devoid of any fracturing fluid (0% of the volume of the inactive grid cell 55 is occupied by fracturing fluid). In prior pending application Ser. No. 10/831,799, filed Apr. 27, 2004, entitled "Method and Apparatus and Program Storage Device for Front Tracking in Hydraulic Fracturing Simulators" which is directed to the 'VOF software' (the disclosure of which is incorporated by reference herein), the 'VOF software' of that prior pending application calculates, over a series of time steps, the 'amount of fracturing fluid that is contained within each of the active grid cells 48a1 that are intersected by the perimeter 46a of the fracture footprint 32'. In other words, the 'VOF software' of prior pending application Ser. No. 10/831,799 calculates, over the series of time steps, the 'amount of fracturing fluid that is contained within each of the tip elements 50'. The 'amount of fracturing fluid that is contained within each of the tip elements 50' is calculated from the 'fill fraction', the 'fill fraction' being denoted by the letter 'F'. For example, in FIG. 8, the 'fill fraction' F for the 'tip element' 54 is 45%. Therefore, the 'VOF software' of prior pending application Ser. No. 10/831,799 calculates, over a series of time steps, the 'fill fraction' (F) for each of the 'active grid cells 48a1 of the mesh 48 that is intersected by the perimeter 46a of the fracture footprint 32'. That is, the 'VOF software' of prior pending application Ser. No. 10/831,799 calculates, over the series of time steps, the 'fill fraction' (F) for each of the 'tip elements' 50 of the mesh 48 of FIG. 8. As a result, by calculating the 'fill fraction' (F) for each of the 'tip elements' 50 over a series of time steps, the amount or degree by which the perimeter 46a of the footprint 32 of the fracture is expanding (or contracting), as a result of the pumping of the fracturing fluid into the perforations 18 in the formation 17 by the pump trucks, can be determined.

Figure 9:
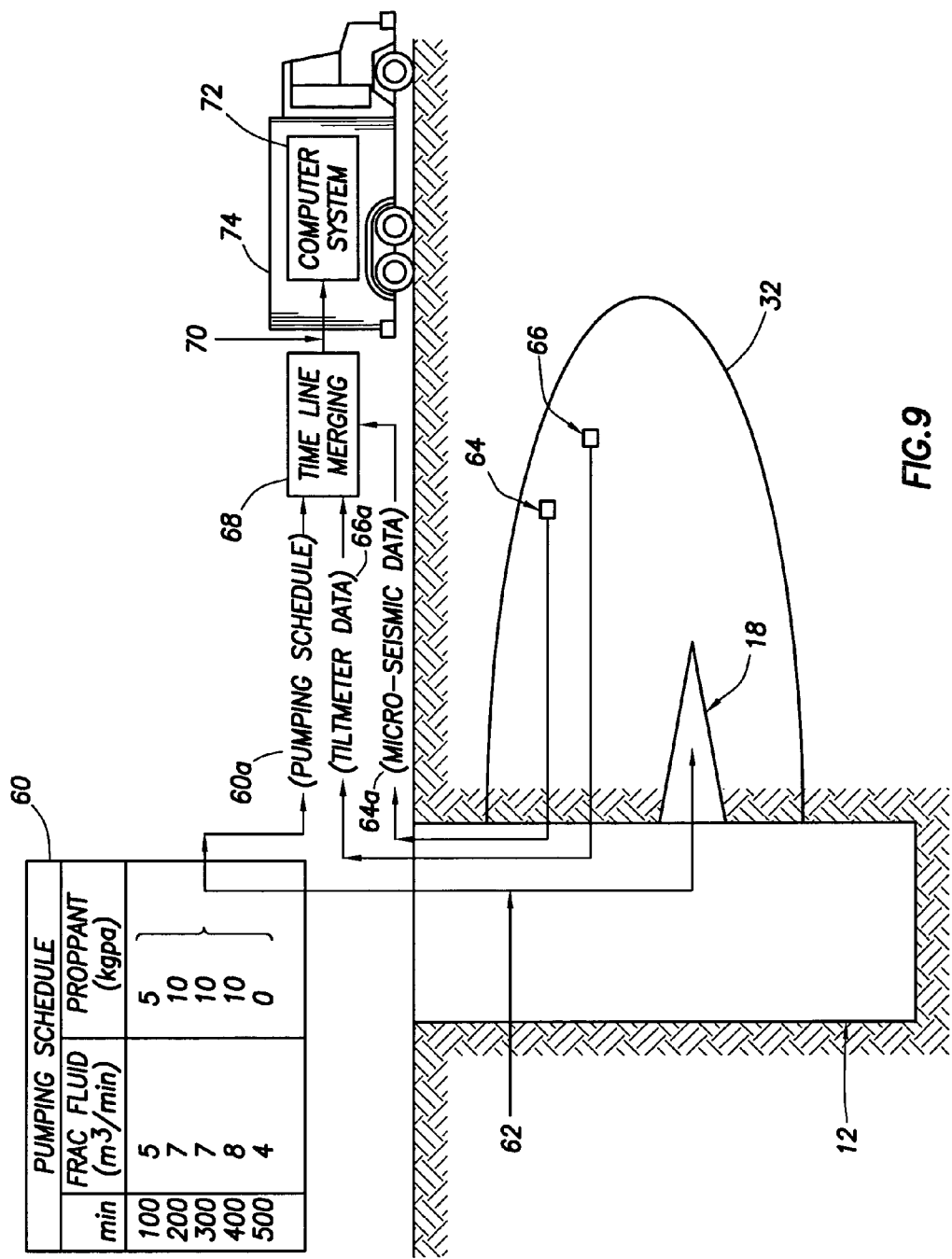
FIG. 9 illustrates an apparatus used in connection with a Hydraulic Fracturing (HF) job adapted for fracturing a formation penetrated by a wellbore, the apparatus including a computer system for storing a software therein called a 'Hydraulic Fracturing Simulator software'.

Referring to FIG. 9, the pump trucks 23 of FIG. 4 will pump a fracturing fluid 62 (frac fluid and proppant 62) down the wellbore 12 in accordance with a pumping schedule 60 (an example used in connection with this discussion). The fracturing fluid 62 will enter the perforations 18, and, responsive thereto, create a 'fracture footprint' 32, similar to the fracture footprint 32 shown in FIG. 7. Micro-seismic data sensor(s) 64 and tiltmeter data or other sensor(s) 66 will monitor the approximate geometry of the fracture footprint 32 and, responsive thereto, the sensor(s) 64 and 66 will generate output signals, the micro-seismic data sensor(s) 64 generating a micro-seismic data output signal 64a, the tiltmeter data sensor(s) 66 generating a tiltmeter data output signal 66a, and the pumping schedule 60 generating a pumping schedule output signal 60a representative of the pumping schedule 60. The pumping schedule output signal 60a, the tiltmeter data output signal 66a, and the micro-seismic data output signal 64a are time line merged via a 'time line merging' step 68. In this 'time line merging' step 68, the pumping schedule output signal 60a, the tiltmeter data output signal 66a, and the micro-seismic data output signal 64a are 'time synchronized' in a particular manner such that the tiltmeter data output signal(s) 66a and the micro-seismic data output signal(s) 64a are synchronized with the times present in the pumping schedule 60. When the 'time line merging' step 68 is complete, a 'time line merged pumping schedule and tiltmeter data and micro-seismic data' output signal 70 is generated which is provided as 'input data' (see 'input data' 82 of FIG. 10) to a 'computer system' 72 optionally disposed within a truck 74 situated at the site of the wellbore, such as a monitoring truck 74 or a 'FracCAT vehicle' 74 (which is a vehicle with software that monitors and measures the fracture and controls the fracture treatment).

Figure 10:
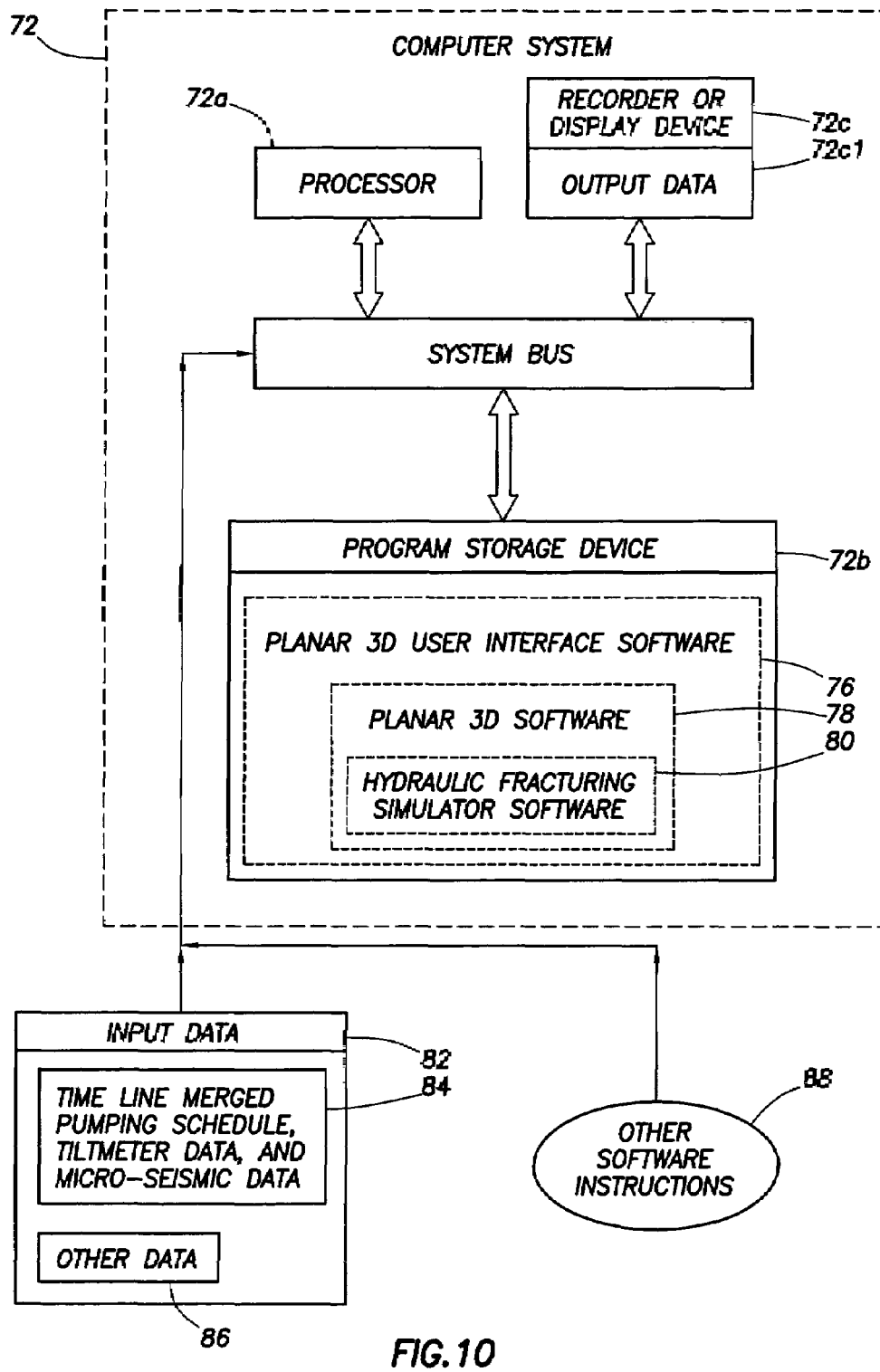
FIG. 10 illustrates the computer system of FIG. 9 which stores the software called a 'Hydraulic Fracturing Simulator software' adapted for modeling 'interfacial slip' or 'debonding' between adjacent Earth formation layers during a 'petroleum reservoir fracturing' event.

Referring to FIG. 10, the 'computer system' 72 which is disposed within the truck 74 of FIG. 9, such as the 'FracCAT vehicle' 74, is illustrated. In FIG. 10, recall that the 'time line merged pumping schedule and tiltmeter data and micro-seismic data' output signal 70 of FIG. 9 is provided as the 'input data' 82 to the computer system 72 disposed within the truck 74, the output signal 70 being comprised of a time line merged pumping schedule and tiltmeter data and micro-seismic data plus other data including downhole temperature and bottom hole pressure. The computer system 72 of FIG. 10 includes a processor 72a operatively connected to a system bus, a memory or other program storage device 72b operatively connected to the system bus, and a recorder or display device 72c operatively connected to the system bus. The memory or other program storage device 72b stores the following software (76, 78, and 80): a Planar 3D User Interface software 76, a Planar 3D 'engine' or software 78, and a Hydraulic Fracturing Simulator Software 80. The software 76, 78, and 80, which is stored in the memory 72b of FIG. 10, can be initially stored on a CD-ROM, where that CD-ROM is also a 'program storage device'. That CD-ROM can be inserted into the computer system 72, and, then, the software 76, 78, and 80, which includes the Hydraulic Fracturing Simulator Software 80, can be loaded from that CD-ROM and into the memory/program storage device 72b of the computer system 72 of FIG. 10. The Hydraulic Fracture Simulator Software 80 will be described in detail in the following paragraphs because the software 80 will model the 'interfacial slip' or 'debonding' which occurs between adjacent layers of the Earth formation. The computer system 72 of FIG. 10 receives Input Data 82, which includes: (1) time line merged pumping schedule, tiltmeter data, and micro-seismic data 84, and (2) Other Data 86. The computer system 72 also receives Other Software Instructions 88. The processor 72a will execute the Hydraulic Fracturing Simulator Software 80 (including the Planar 3D User Interface software 76 and the Planar 3D 'engine' 78), while simultaneously using the Input Data 82 and Other Software Instructions 88; and, responsive thereto, the recorder or display device 72c will generate a set of 'Output Data' 72c1 which is adapted to be recorded by or displayed on the recorder or display device 72c. The computer system 72 may be a personal computer (PC), a workstation, or a mainframe. Examples of possible workstations include a Silicon Graphics Indigo 2 workstation or a Sun SPARC workstation or a Sun ULTRA workstation or a Sun BLADE workstation. The memory or program storage device 72b is a computer readable medium or a program storage device which is readable by a machine, such as the processor 72a. The processor 72a may be, for example, a microprocessor, microcontroller, or a mainframe or workstation processor. The memory or program storage device 72b, which stores the Hydraulic Fracturing Simulator Software 80, may be, for example, a hard disk, ROM, CD-ROM, DRAM, or other RAM, flash memory, magnetic storage, optical storage, registers, or other volatile and/or non-volatile memory.

Figure 12:
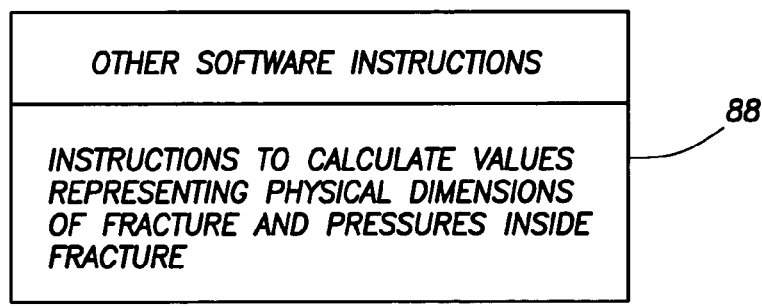
FIG. 12 illustrates the 'Other Software Instructions' of FIG. 10.

Referring to FIGS. 11 and 12, the Other Data 86 and the Other Software Instructions 88 of FIG. 10 is illustrated. In FIG. 11, the Other Data 86 will include: layer confining stresses and properties, perforating interval and depth, wellbore data, fluid and proppant properties, time history of fluid volumes to be pumped, time history of proppant volumes to be pumped, and logs identifying the identity, properties, and location of geological zones. In FIG. 12, the Other Software Instructions 88 include instructions to calculate values representing physical dimensions of the fracture and pressures inside the fracture.

Referring to FIG. 13, a construction of the Hydraulic Fracturing Simulator Software 80 disposed within the Planar 3D software 78 and the Planar 3D User Interface 76 is illustrated. In FIG. 13, the Input Data 82 is provided to the Planar 3D User Interface 76, to the Planar 3D software 78, and to the Hydraulic Fracturing Simulator Software 80. The Hydraulic Fracturing Simulator Software 80 includes: an initial 'time stepping' step 90, a second step 92 which calculates fracture width (w) given the fluid pressure (p); a third step 94 which calculates fluid pressure (p) given the fracture width (w); and a fourth step 96 adapted to update the fracture footprint. The fracture 'footprint' 32 is shown in FIGS. 4 and 13 at times $t_1, t_2, t_3, \ldots, t_n$. In operation, note the time stepping loop 98 in FIG. 13 wherein the 'time stepping' step 90 will increment from a first time step $(t_1)$, to a second time step $(t_2)$, to a third time step $(t_3)$, ..., and to an nth time step $(t_n)$. Operating within the first time step $t_1$, the second step 92 and the third step 94 will iterate on each other (as indicated by arrow 100) until the fracture width (w) and the fluid pressure (p) are solved at every point in the fracture geometry of FIG. 4. When the iteration 100 of steps 92 and 94 has 'converged', the fracture footprint is updated in step 96. In step 97, the proppant concentration is calculated for each grid cell in the updated fracture footprint. The 'output data' 72c1, associated with the last iteration loop 100, is generated and stored. 'Convergence' takes place when the 'solution does not change from one iteration to the next'. The time step 90 is then incremented to the second time step $t_2$, and, responsive thereto, the second step 92 and the third step 94 will then iterate again on each other (as indicated by arrow 100) until the fracture width (w) and the fluid pressure (p) are solved at every point in the fracture geometry of FIG. 4. When the iteration 100 of steps 92 and 94 is complete, the fracture footprint is updated in step 96. In step 97, the proppant concentration is calculated for each grid cell in the updated fracture footprint. The 'output data' 72c1, associated with the last iteration loop 100, is generated and stored. The time step 90 is then incremented once again to the third time step $t_3$, the second step 92 and the third step 94 will then iterate again on each other (as indicated by arrow 100) until the fracture width (w) and the fluid pressure (p) are solved at every point in the fracture geometry of FIG. 4. When the iteration 100 of steps 92 and 94 has converged, the fracture footprint is updated in step 96. In step 97, the proppant concentration is calculated for each grid cell in the updated fracture footprint. The 'output data' 72c1, associated with the last iteration loop 100, is generated and stored. The time step 90 is then incremented once again, and the above process repeats until a user specified time is reached. The inner iteration loop 100 is solving for two values: (1) fracture width (w) using the 'elasticity equation', and (2) fluid pressure (p) using the 'fluid flow equations'. Thus, the 'solution does not change from one iteration to the next' when the change in the 'elasticity equation' solution and when the change in the 'fluid flow equation' solution is below a 'tolerance'. When the change in the 'elasticity equation' solution and the change in the 'fluid flow equation' solution is below the 'tolerance', we know that the inner iteration loop 100 has converged. In particular, the aforesaid 'convergence' will be achieved when the difference between the fracture width (w) of step 92 in the current iteration of loop 100 and the fracture width (w) of step 92 in the previous iteration of loop 100 is less than or equal to a small value $\epsilon$, and the difference between the fluid pressure (p) of step 94 in the current iteration of loop 100 and the fluid pressure (p) of step 94 in the previous iteration of loop 100 is less than or equal to a small value ϵ. The Output Data 72c1 is generated at the end of each time step. However, 'additional output data' 99 is generated when the time stepping in the outer iteration loop 98 is complete, the 'additional output data' 99 being used in subsequent calculations, such as in the generation of other graphical plots. In addition, steps 92 and 94 can be solved in various ways, such as by iteration of two equations as shown here, or by direct substitution of the results of one equation into the other equation, or vice-versa.

In FIG. 13, however, before the second step 92, a first step 102 is practiced, the first step 102 being called 'Set Up Influence Coefficient Matrix [C]' 102. The 'Set Up Influence Coefficient Matrix [C]' step 102 of FIG. 13 will be discussed below with reference to FIG. 14 of the drawings.

Referring to FIG. 14, an 'elasticity equation' 33 is illustrated. In FIG. 14, recall from steps 92 and 94 in FIG. 13 that step 92 will calculate the fracture width (w) using the 'Elasticity Equation' and step 94 will calculate the fluid pressure (p) using the 'Fluid Flow Equations'. In FIG. 14, the fracture width (w) of step 92 is actually calculated by using an 'Elasticity Equation' 33. In the 'Elasticity Equation' 33, the fracture width (w) 35 is calculated given the inverse of a 'matrix of influence coefficients [C]' 37, or 'Influence Coefficient Matrix [C]' 37 multiplied by (fluid pressure 'p' 39 minus confining stress $\sigma_c$ 41), as follows:

$$\{w\} = [C]^{-1}\{p - \sigma_c\}, \text{ where} \qquad \text{Elasticity Equation 33:}$$

'w' is the fracture width 35,
'[C]' is the 'matrix of influence coefficients' 37, and superscript '−1' indicates its inverse,
'p' is the fluid pressure 39, and
'$\sigma_c$' is the confining stress 41.

In FIG. 14, a generic form of the 'Influence Coefficient Matrix [C]' 37 is shown, where the 'Influence Coefficient Matrix [C]' 37 has 'M' rows and 'M' columns. In FIG. 14, the 'Influence Coefficient Matrix [C]' 37 is fully populated with numbers 43 and is used to calculate fracture width (w) for step 92 in FIG. 13.

The 'elasticity equation' 33 usually assumes that all layers in a reservoir are fully bonded and, as a result, there exists no 'slip' 27 or other debonding between adjacent layers of a reservoir, such as between layers 17e and 17f of FIG. 4. However, in a real reservoir, 'slip' 27 could exist between adjacent layers of a reservoir.

Therefore, the Hydraulic Fracturing Simulator software 80 disclosed in this specification will model the effect of, or take into account the existence of, the 'slip' 27 which may exist between adjacent layers of a reservoir (such as between layers 17e and 17f of FIG. 4). Consequently, in order for the Hydraulic Fracturing Simulator software 80 to model the effect of, or take into account the existence of, the 'slip' 27 which may exist between adjacent layers of a reservoir, it is necessary to calculate the 'Influence Coefficient Matrix [C]' 37 in the 'Elasticity Equation' 33 in a special way (which follows FIGS. 17 and 18) in order to model the effect of the 'slip' 27 or the 'debonding' 27 which may exist between adjacent layers of a reservoir. When the 'Influence Coefficient Matrix [C]' 37 of the 'Elasticity Equation' 33 of FIG. 14 is calculated in the 'special way' (outlined below with reference to FIGS. 17 and 18), the numbers 43 in the 'Influence Coefficient Matrix [C]' 37 will be changed. As disclosed in this specification, there is a systematic way for determining and changing the numbers 43 in the 'Influence Coefficient Matrix' 37 of FIG. 14 in order to model and take into account the existence of 'slip' 27 or 'debonding' 27 between adjacent layers of a reservoir. Consequently, the following pages of this specification will present a 'method' (along with an accompanying 'system' and 'program storage device'), practiced by the Hydraulic Fracturing Simulator software 80, for determining how the numbers 43 in the 'Influence Coefficient Matrix [C]' 37 will be changed in order for the Hydraulic Fracturing Simulator software 80 to model and take into account the existence of the 'slip' 27 and/or the 'debonding' 27 which may exist between adjacent layers of a reservoir, such as between layers 17e and 17f or between layers 17g and 17h of the reservoir shown in FIG. 4.

Figure 15:
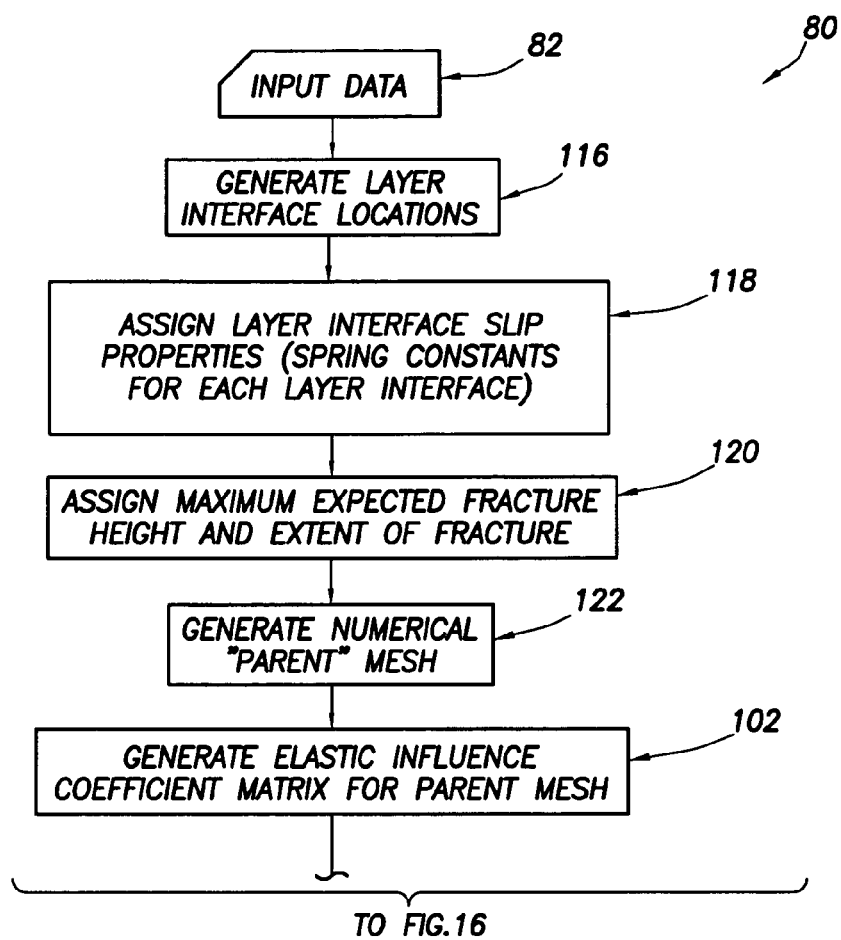
FIGS. 15 and 16 illustrate a more detailed construction of the 'Hydraulic Fracturing Simulator software' which is illustrated in FIG. 13.
Figure 16:
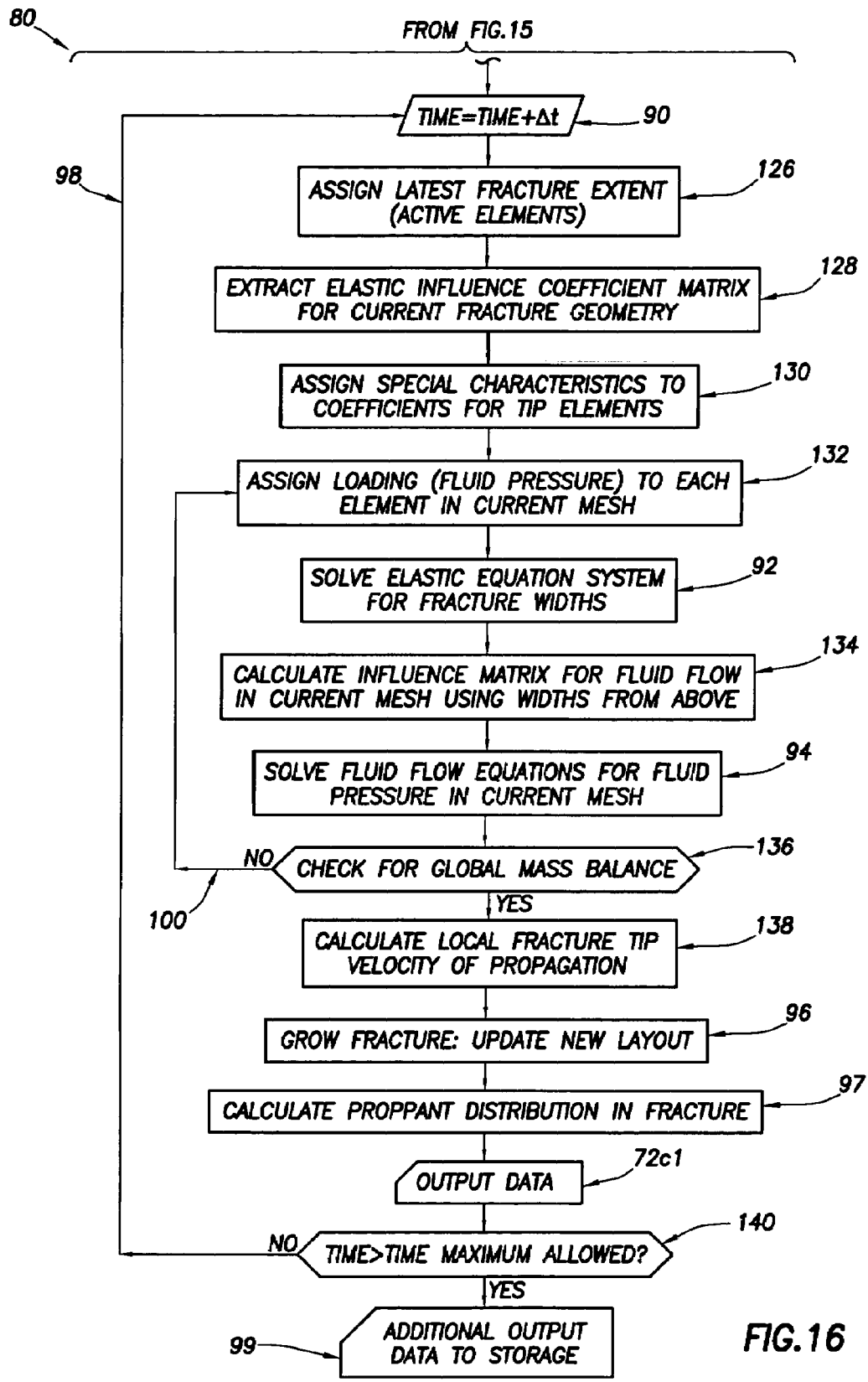

Referring to FIGS. 15 and 16, a more detailed construction of the Hydraulic Fracturing Simulator Software 80 of FIG. 13, which is disposed within the Planar 3D software 78 and the Planar 3D User Interface 76, is illustrated.

In FIG. 15, the Input Data 82 is provided from the human interface, such as the pumping schedule, which includes the injection rate and the proppant as a function of time, proppant concentration, fluid viscosity, the geology or the properties of the elastic layers of the reservoir including the elastic constants comprising the Young's Modulus and the Poisson's Ratio (E, v) as previously described, and the leakoff behavior. In FIG. 15, in the 'Generate Layer Interface Locations' step 116, the depths of each of the 'interfaces' (31 of FIG. 5) of the 'layers' (17a-17j of FIG. 5) of FIG. 13 are calculated, such as the end of the sandstone layer, the end of the gas layer, etc. In the 'Assign Layer Interface Slip Properties (spring constants for each layer interface)' step 118, the spring constants for each layer interface are assigned to each of the 'layers' (of FIG. 4) the depths of which were calculated in step 116. In the 'Assign Maximum Expected Fracture Height and Extent of Fracture' step 117 of FIG. 15, before any simulation is performed, the maximum possible 'length' to which the 'fracture' will propagate and the maximum possible 'height' to which the 'fracture' will propagate is assumed or introduced; then, a parent mesh is assigned to the 'fracture', where the parent mesh is divided into rectangular 'elements'. See FIG. 8 for an example of the parent mesh with rectangular 'elements'. The parent mesh is broken down into intersecting rows and columns comprising 'grids' or 'elements' which are generally rectangular in shape. It is assumed that the 'fracture' will grow into the 'elements' of the parent mesh, but no further. In the 'Generate Numerical Parent Mesh' step 122, the numerical parent mesh is generated; that is, in step 122, the 'coordinates' of each 'grid cell' or 'element' of the parent mesh are generated. The 'coordinates' will define where each 'grid cell' or 'element' exists within an axis system, such as the (x, y) axis system (and recall that the fracture footprint 46 of FIG. 8 is assumed, by the model of this specification, to lie in the 2D plane, although, in principle and in reality, the fracture footprint 46 does lie in the 3D plane). Therefore, in step 122 of FIG. 15, the 'coordinates' of each of the 'grid cells' (such as 'grid cells' 48 shown in FIG. 8) are allocated. At this point, we know where our 'layers' exist, we know the numerical mesh which includes the rectangular mesh of elements, and we know where the fracture exists within the parent mesh including all their coordinates. In FIG. 15, the next step is the 'Generate Elastic Influence Coefficient Matrix for Parent Mesh' step 102, which is the same step as the 'Set up Influence Coefficient Matrix [C]' step 102 of FIG. 13. In step 102 of FIGS. 13 and 15, the Influence Coefficient Matrix [C] (37 of FIG. 14) is generated. As previously mentioned, the Influence Coefficient Matrix [C] (37 as shown in FIG. 14) comprises rows and columns of 'numbers' 43, the Influence Coefficient Matrix [C] being fully populated with such 'numbers' 43. Each of the 'numbers' 43 of the Influence Coefficient Matrix [C] will indicate how one 'element' of the mesh relates to another 'element' of the mesh in an 'elastic manner'. For example, if a fracture exists within one 'element' of the mesh, the numbers 43 indicate what kind of stress or strain exists within another 'element' of the mesh in response thereto (a phenomenon that is called an 'elasticity behavior'). Each of the 'numbers' 43 in the Influence Coefficient Matrix [C] 37 describe this 'elasticity behavior'. Therefore, the Influence Coefficient Matrix [C] (37 of FIG. 14) is a matrix that indicates how one 'element' of the parent mesh (such as the mesh shown in FIG. 8) talks to another 'element' of the parent mesh in an 'elastic manner'. This phenomenon will be discussed later in the functional description. Therefore, step 102 of FIGS. 13 and 15 (i.e., the 'Set Up Influence Coefficient Matrix' step 102 of FIG. 13 and the 'Generate Elastic Influence Coefficient Matrix for Parent Mesh' step 102 of FIG. 15), which determines the Influence Coefficient Matrix 37 of FIG. 14, is responsible for allowing the Hydraulic Fracturing Simulator Software 80 of FIGS. 10 and 13 to simulate the 'slip' 27 or the 'debonding' 27 of FIGS. 4 and 5.

In FIG. 16, the 'Time=Time+Δt' step 90 is a 'time stepping' step. Note the loop 98 which represents a time stepping loop. The loop 98 controls how the fracture grows as a function of time during the duration of the pumping schedule. In the 'Assign Latest Fracture Extent (Active Elements)' step 126, at any particular time step, the fracture will have propagated to some extent in the parent mesh, which is called the 'footprint' of the fracture; step 126 will sweep through all the 'grid cells' or 'elements' in the entire parent mesh, and then step 126 will determine if a particular 'element' or 'grid cell', within the perimeter of the 'fracture footprint', is an 'inactive element', or an 'active element', or a 'partially active element'. In step 128 entitled 'Extract Elastic Influence Coefficient Matrix for Current Fracture Geometry', the Influence Coefficient Matrix [C] 37, as previously described with reference to step 102, contains 'all possible combinations within the parent mesh'; and, at any particular time step, we need a subset of the aforementioned 'all possible combinations within the parent mesh'; thus, step 128 extracts, from the Influence Coefficient Matrix [C] 37, a 'submatrix' which contains essential information regarding the current size of the 'fracture footprint'. In step 130 entitled 'Assign Special Characteristics to Coefficients for Tip Elements', a 'particular subset' of the 'grid cells' or 'elements' of the parent mesh will cross a 'perimeter of the fracture footprint'; in connection with only the 'particular subset' of the 'grid cells' which cross the 'perimeter of the fracture footprint', it is necessary to change some of the properties of the 'submatrix' (and recall that the 'submatrix' contains essential information regarding the current size of the 'fracture footprint'); step 130 will make this change to the 'submatrix'. In step 132 entitled 'Assign Loading (Fluid Pressure) to Each Element in Current Mesh', we now have a current time step and a current fracture footprint; in addition, each 'active element' has a 'fluid pressure'; thus, step 132 will assign a 'fluid pressure' to each 'element' of the parent mesh. In step 92 entitled 'Solve Elastic Equation System for Fracture Widths', we use the 'Elasticity Equation' 33 of FIG. 14 (including their Fourier Transforms) to solve for the 'fracture width' in each 'element' or 'grid cell' of the parent mesh (of FIG. 8), at the current time step, given the 'fluid pressure' that was assigned to each 'element' of the mesh in step 132. In step 134 entitled 'Calculate Influence Matrix for Fluid Flow in Current Mesh Using Widths from Above', now that we have calculated the 'fracture width' in each 'element' at the current time step from step 92, we can do the same thing for the fluid flow equations in step 94. Therefore, in step 94 entitled 'Solve Fluid Flow Equations for Fluid Pressure in Current Mesh', we can solve for the 'fluid pressures'. Note the loop 100 in FIG. 13 whereby, when the 'fluid pressures' are determined in step 94, those 'fluid pressures' determined from step 94 are used to solve for 'fracture widths' in step 92, and that loop 100 will continue to process as indicated until 'global mass balance' is achieved in step 136. Thus, from step 136 to step 132, an inner iteration will take place; in that inner iteration, we continue to iterate on fluid pressure and fracture width until convergence of the solution takes place at that time step; convergence takes place when the solution does not change from one iteration to the next. The inner iteration loop 100 is solving for two values: (1) fracture width using the 'Elasticity Equation' 33, and (2) the fluid pressure using the 'fluid flow equations'; when the change in each of these 'equations' is below a tolerance, we know that the inner iteration 100 has converged. Steps 138, 96, and 140 involve updating for the next time step. Step 138 ('Calculate Local Fracture Tip Velocity of Propagation') and step 96 ('Grow Fracture: Update New Layout') are described in prior pending application Ser. No. 10/831,799, filed Apr. 27, 2004, directed to the 'VOF Algorithm', entitled "Method and Apparatus and Program Storage Device for Front Tracking in Hydraulic Fracturing Simulators", the disclosure of which is incorporated by reference into the specification of this application. In step 97, the proppant concentration is calculated for each grid cell in the updated fracture footprint. The 'output data' 72*c*1, associated with the last iteration of loop 100, is generated and stored. In step 140, if the 'time' is greater than the maximum allowed, 'additional output data' 99 is generated, the 'additional output data' 99 being stored in a storage device, such as the memory or program storage device 72*b* of FIG. 16. The 'additional output data' 99 is used in subsequent calculations, such as in the generation of other graphical plots.

Figure 19:
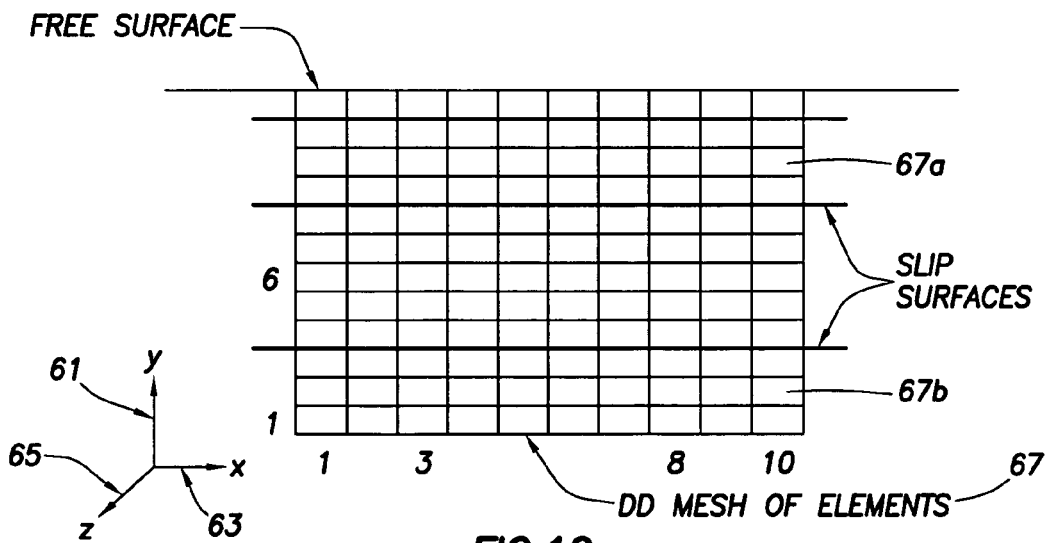
FIG. 19 is a numerical mesh which is used in conjunction with the flowcharts illustrated in FIGS. 17 and 18.

In FIG. 16, the Output Data 72*c*1 includes, at each time step, the fluid pressure (p) and the fracture width (w) at each of the 'elements' or 'grid cells' 48*a*1 of FIG. 8 or 'elements' 67*a* and 67*b* of FIG. 19 (again, at each time step). Since the Output Data 72*c*1 includes fluid pressure (p) and fracture width (w) for each 'grid cell' or 'element' of FIGS. 8 and 19 at each time step, the Output Data 72*c*1 can also include a number of 2D or 3D plots representative of the fluid pressure (p) and the fracture width (w) at each of the 'elements' or 'grid cells' of FIGS. 8 and 19 at each time step. Steps 92, 134, and 94 can be solved in various ways, such as by iteration of the two equations shown here (i.e., the 'elasticity equation' and the 'fluid flow equation'), or by direct substitution of the results of one equation into the other equation, or vice-versa.

Figure 17:
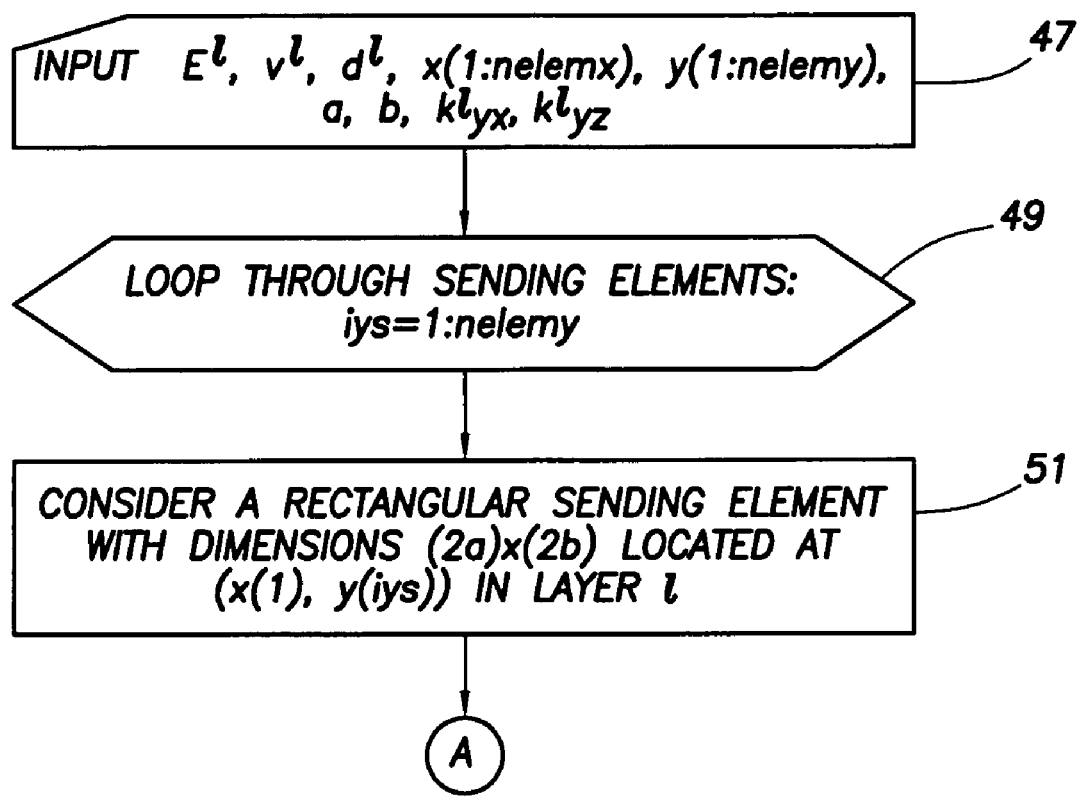

Referring to FIGS. 17 and 18, a detailed construction of the 'Set Up Influence Coefficient Matrix' step 102 of FIG. 13 and the 'Generate Elastic Influence Coefficient Matrix for Parent Mesh' step 102 of FIG. 15 is illustrated (note that step 102 of FIG. 13 is the same step as step 102 in FIG. 15). In FIGS. 17 and 18, a flowchart is illustrated which depicts how the numbers 43 in the 'Influence Coefficient Matrix [C]' 37 are changed in order to allow the 'Hydraulic Fracturing Simulator software' 80 of FIG. 10 to model and 'take into account the existence of' the 'slip' 27 and/or the 'debonding' 27 which may exist between adjacent layers of a reservoir. In particular, the flowchart of FIGS. 17 and 18 depicts the series of steps needed to recalculate the 'Influence Coefficient Matrix [C]' 37 for the case when any 'layer interfaces' may 'slip' 27 or 'debond' 27, such as the interfaces between layers 17e/17f, and between layers 17g/17h of FIG. 4.

In FIG. 17, step 47, initial 'input data' is supplied to the algorithm, such as the layer elastic Young's modulus $E^l$ and Poisson's ratio $v^l$, layer thickness $d^l$, and linear spring constants $k_{yx}^l$ and $k_{yz}^l$, where l is the layer interface number. The linear spring constants $k_{yx}^l$ and $k_{yz}^l$ are used to ascribe physical stiffnesses to each layer interface, and relate directly the 'interfacial shear stresses' to the 'shear displacements'. With respect to the term 'x(1:nelemx)' of the input data 47, the term 'x(1:nelemx)' refers to the x direction, with a maximum of 'nelemx' elements in the x direction 63 of FIG. 19; and, with respect to the term 'y(1:nelemy)' of the input data 47, the term 'y(1:nelemy)' refers to the y direction, with a maximum of 'nelemy' elements in the y direction 61 of FIG. 19. The term '1:nelemx' represents a loop from "1, 2, 3, . . . , nelemx" over all elements in the x-direction, and the term '1:nelemy' represents a loop from "1, 2, 3, . . . , nelemy" over all elements in the y-direction. With respect to the terms 'a' and 'b', each rectangularly shaped element or 'grid cell' 67a, 67b of FIG. 19 has a local dimension of '2a by 2b' in the x and y directions 63 and 61 of FIG. 19, respectively.

In FIG. 17, step 49, we loop through each "sending" element iys of the numerical mesh 67 of FIG. 19 in a direction that is orthogonal to the direction of the layer interfaces (defined as the y direction, with a maximum of nelemy elements in the y direction 61 of FIG. 19). The definition of a "sending" element is set forth below.

In FIG. 17, step 51, a 'numerical mesh' 67 of FIG. 19 (which is the same 'mesh' as the 'mesh' which is shown in FIG. 8 that overlays the fracture footprint 46) consists of a mesh of rectangular shaped 'elements' or 'grid cells', such as 'elements' 67a and 67b, each rectangularly shaped 'element' or 'grid cell' 67a, 67b of FIG. 19 having a local dimension of '2a by 2b' in the x and y directions 63 and 61 of FIG. 19, respectively (the x direction 63 of FIG. 19 is defined to be parallel to the layer interface direction, in the plane of FIG. 4).

A "sending" element will be defined in the following manner: Any element in the numerical mesh 67 can send stress data to any other element in the numerical mesh 67. This is the way in which the influence coefficient matrix [C] 37 is populated—an element sending 'stress data' to another element is referred to as a "sending" element, and an element which receives and records such 'stress data' in the matrix [C] 37 is the "receiving" element. In order to populate matrix [C] 37, each element in the numerical mesh 67 takes its turn in being the "sending" element, and it sends stress data to all other elements, including itself, in the numerical mesh 67, and all other elements are then "receiving" elements at which stress data is recorded. This process is repeated until all elements have in turn become "sending" elements and the matrix [C] 37 is fully populated.

In FIG. 18, step 53 includes steps 53a, 53b, 53c, 53d, and 53e. For each 'sending element' in step 49 of FIG. 17, we calculate the layer benchmark stresses "$\sigma_{zz}^l$ (x(ixr=1: nelemx), y(iyr=1:nelemy))" at all locations in the numerical mesh by means of the steps 53a through 53e of step 53, where direction 'z' 65 is out of the plane of FIG. 4, as indicated in FIG. 19 and 'l' is the layer number.

In FIG. 18, step 53a, we solve equation (8), which is set forth below as follows:

$$\begin{bmatrix} 0 \\ \hat{\sigma}_{yx}/k_{yx} \\ \hat{\sigma}_{yz}/k_{yz} \end{bmatrix}^l = \begin{bmatrix} \Delta \hat{u}_y \\ \Delta \hat{u}_x \\ \Delta \hat{u}_z \end{bmatrix}^l \quad (8)$$

$$= R_{bt}^{l+1} \begin{bmatrix} \hat{\sigma}_{yy} \\ \hat{\sigma}_{yx} \\ \hat{\sigma}_{yz} \end{bmatrix}_t^{l+1} +$$

$$(R_{bb}^{l+1} - R_{tt}^l) \begin{bmatrix} \hat{\sigma}_{yy} \\ \hat{\sigma}_{yx} \\ \hat{\sigma}_{yz} \end{bmatrix}_t^l - R_{tb}^l \begin{bmatrix} \hat{\sigma}_{yy} \\ \hat{\sigma}_{yx} \\ \hat{\sigma}_{yz} \end{bmatrix}_t^{l-1}$$

for $\hat{\sigma}_{yy}^l$, $\hat{\sigma}_{yx}^l$, and $\hat{\sigma}_{yz}^l$ due to the current sending element to thereby yield a Fourier Transform (FT) of the interface stresses-displacement vectors $\hat{T}^l(k, y)$. Use equation (4), which is set forth below as follows:

$$\Delta u^l = u_b^{l+1} u_t^l = R_{bt}^{l+1} p_t^{l+1} + (R_{bb}^{l+1} - R_{tt}^l) p_t^l - R_{tb}^l p_t^{l+1} + R_{bb}^{l+1} \Delta p^l - R_{tb}^l \Delta p^{l-1} \quad (4)$$

to calculate $\hat{u}_y^l$, $\hat{u}_x^l$, and $\hat{u}_z^l$ and to thereby form the vector $\hat{T}^l(k,y)$ in equation (3), where equation (3) is set forth below as follows:

$$\hat{T}^l(k, y) = Z^l(k, y) A^l(k) \quad (3)$$

Use equation (3) to determine the layer spectral coefficients $A_j^l(k)$. Determine the normal stress component $\hat{\sigma}_{zz}^l$ in the fracture plane from:

$$\hat{\sigma}_{zz}^l(m, n, y) = \sum_p A_p^l(k) c_p^l(m, n, y) e^{\varepsilon_p k y},$$

where $c_p^l(m,n,y)$ depends on the layer elastic moduli and $\varepsilon_p = \pm 1$. See explicit expressions for "$c_p^l(m,n,y)$" and the corresponding "$\varepsilon_p$" in the following reference: A. P. Peirce, and E. Siebrits, "Uniform asymptotic approximations for accurate modeling of cracks in layered elastic media", International Journal of Fracture, 110, 205-239, 2001, the disclosure of which is incorporated by reference into the specification of this application.

In FIG. 18, step 53b, we calculate the "low" frequency components (note the superscript 'LOW' in FIG. 18) by subtracting off a three-layer and two-interface "Uniform Asymptotic Solution (UAS)" (see the superscript 'UAS' in equation 53b1 of FIG. 18) to obtain the equation indicated by element numeral 53b1 of FIG. 18, where equation 53b1 is duplicated below, as follows:

$$(\hat{\sigma}_{zz}^l)^{LOW} = \hat{\sigma}_{zz}^l - (\hat{\sigma}_{zz}^l)^{UAS}$$

Note that the "Uniform Asymptotic Solution (UAS)" is an analytic solution obtained by superimposing two bonded half-space solutions to obtain an approximation to a 3-layer and 2-interface solution that contains the dominant high frequency components. This enables one to separate the low frequency components in a multilayer solution (which can be inverted efficiently by numerical integration) from the high frequency components represented by the UAS (which can be inverted in closed form). This leads to an efficient and accurate means to determine the desired influences due to individual displacement discontinuity elements.

In FIG. 18, step 53c, we invert the 'Uniform Asymptotic Solution (UAS)' analytically, as follows:

$$(\sigma_{zz}^l(x,y,z))^{UAS} = \frac{1}{(2\pi)^2}\int_{-\infty}^{+\infty}\int_{-\infty}^{+\infty} e^{-i(mx+nz)}(\hat{\sigma}_{zz}^l(m,n,y))^{UAS} dm\, dn$$

In FIG. 18, step 53d, we invert the low frequency FT components $(\hat{\sigma}_{zz}^l)^{LOW}$ numerically, as follows:

$$(\sigma_{zz}^l(x,y,z))^{LOW} = \frac{1}{(2\pi)^2}\int_{-\infty}^{+\infty}\int_{-\infty}^{+\infty} e^{-i(mx+nz)}(\hat{\sigma}_{zz}^l(m,n,y))^{LOW} dm\, dn.$$

Finally, in FIG. 18, step 53e, we combine the low frequency stresses and the 'Uniform Asymptotic Solution (UAS)' stresses to obtain the stresses due to the current sending element, which is represented by equation 53e1 in FIG. 18, as follows:

$\sigma_{zz}^l = (\sigma_{zz}^l)^{LOW} + (\sigma_{zz}^l)^{UAS}$ (equation 53e1)

Not shown in FIGS. 17 and 18 is that we then store the stresses $\sigma_{zz}^l$ of equation 53e1 in the 'Influence Coefficient Matrix [C]' 37 in the following manner: C(numr,iys)=$\sigma_{zz}^l$(ixr,iyr), where numr=(ixr−1)*nelemy+iyr. The manner of storage is a compact form of the actual Influence Coefficient Matrix [C] 37, containing only essential data that are needed to define all unique entries in the Influence Coefficient Matrix [C] 37 and eliminating any duplicated entries.

Also not shown in FIGS. 17 and 18 is that we then increment the sending element number "iys" by 1 and repeat steps 49, 51, and 53 of FIGS. 17 and 18 for the next sending element. That is, after the steps 53 shown in FIG. 18 and the steps of storing and incrementing described immediately above, we return to step 49 of FIG. 17.

After completion of steps 49, 51, and 53 for all sending elements in the numerical mesh 67 of FIG. 19, store the Influence Coefficient Matrix [C] 37 of FIG. 14 on a storage device (such as a disk) for later use by the Planar 3D software 78 and by the Hydraulic Fracturing Simulator software 80 in the 'Calculate Fracture Width (w) . . . ' step 92 of FIG. 13.

A functional description of the operation of the present invention will be set forth below with reference to FIGS. 1 through 19 of the drawings.

The 'slip' or debonding' 27 between adjacent Earth formation layers 17e and 17f and between adjacent Earth formation layers 17g and 17h of FIGS. 4 and 5 may occur, and, as a result, fluid can propagate within the slip zone 27, such as at the interface 31 between layers 17e and 17f of FIG. 5. As the fracture 29 of FIG. 5 grows toward the interface 31, the slip zone 27 can stop the growth of the fracture 29, and control the height of the fracture 29. Therefore, it is important that the Hydraulic Fracturing Simulator software 80 of FIG. 10 model the 'slip' 27 or 'debonding' 27 of FIGS. 4 and 5 and its effect on the fracture 29. The 'slip' 27 of FIGS. 4 and 5 can be modeled using the workstation or other computer system 72 shown in FIG. 10.

The input data 82, which is provided as input data to the computer system 72 of FIG. 10, may include: reservoir layer rock properties, elastic constants per layer, confining stress in each layer, leakoff into the formation per layer, thickness of each layer, spring constants per layer interface, and fluid schedule. In particular, in FIG. 17, the input data 82 which is provided as input data to the computer system 72 of FIG. 10 would also include: the elastic Young's modulus $E^l$ and Poisson's ratio $v^l$ for each layer 17a-17j of the formation 17 of FIG. 4, the thickness $d^l$ of each layer 17a-17j, linear spring constants $k_{yx}^l$ and $k_{yz}^l$, where l is the layer number, 'x(1:nelemx)' referring to the x direction with a maximum of nelemx elements in the x direction 63, 'y(1:nelemy)' referring to they direction with a maximum of nelemy elements in they direction 61; and 'a' and 'b' referring to the local dimension of '2a by 2b' in the x and y directions 63 and 61 of FIG. 19, respectively, associated with each rectangularly shaped 'element' or 'grid cell' 67a and 67b of FIG. 19.

The processor 72a of FIG. 10 will execute the 'Hydraulic Fracturing Simulator software' 80, which is embodied within the Planar 3D software 78 and the Planar 3D user interface 76, while simultaneously using the 'input data' 82 as described above. As a result, the 'output data' 72c1 is generated, the 'output data' 72c1 being either printed as a printout on the recorder or display device 72c or displayed on the display screen of recorder or display device 72c of FIG. 10. The 'output data' 72c1 may include the fracture footprint at each time step, the fluid pressure (p) and the fracture width (w) at each rectangularly shaped 'element' or 'grid cell' 48a1 of FIG. 8 and 67a, 67b of FIG. 19 associated with the 'fracture footprint' at times $t_1, t_2, t_3, \ldots, t_n$ shown in FIG. 4, the distribution of proppant concentration, and other outputs of the simulator, such as fracture conductivity and net pressure.

When the 'Hydraulic Fracturing Simulator software' 80 (embodied within the Planar 3D software 78 and the Planar 3D user interface 76) is executed by the processor 72a of the computer system 72 of FIG. 10 while using the input data 82 to generate the output data 72c1, the following steps are practiced by the processor 72a.

The processor 72a, responsive to the input data 82, executes the 'Set Up Influence Coefficient Matrix [C]' step 102 in FIG. 13 (and the 'Generate Elastic Influence Coefficient Matrix for Parent Mesh' step 102 in FIG. 15 which is the same step as step 102 in FIG. 13). In the 'Set Up Influence Coefficient Matrix [C]' step 102, the 'Influence Coefficient Matrix [C]' 37 of the Elasticity Equation 33 of FIG. 14 is 'calculated in a special way' in order to allow the Hydraulic Fracturing Simulator Software 80 to model and take into account the effect of the 'slip' 27 and/or the 'debonding' 27 between adjacent layers of a reservoir (such as between adjacent layers 17e/17f and 17g/17h). In order to model and take into account the effect of 'slip' 27 or 'debonding' 27, the 'Influence Coefficient Matrix [C]' 37 is calculated in a 'special way' by the processor 72a of computer system 72, the processor 72a executing the steps 47, 49, 51 and 53 of FIGS. 17 and 18 for the purpose of calculating the 'Influence Coefficient Matrix [C]' 37 of FIG. 14 in that 'special way'.

In FIG. 17, the processor 72a begins the calculation of the 'Influence Coefficient Matrix [C]' 37 in that 'special way' by looping through each 'sending element' of the numerical mesh 67 of FIG. 19 in a direction that is orthogonal to the layer interfaces, defined as the y-direction 61 in FIG. 19. The processor 72a begins with 'element or grid cell (67a/67b of FIG. 19) number 1' and ends with a maximum of 'nelemy' elements in the y-direction 61. In order to populate the 'Influence Coefficient Matrix [C]' 37, each 'element or grid cell' (67a/67b) in the numerical mesh 67 of FIG. 19 takes its turn in being the "sending" element, and it sends stress data to all other elements, including itself, in the numerical mesh 67, and all other elements are then "receiving" elements at which stress data is recorded. This process is repeated until all 'elements or grid cells' (67a/67b) have, in turn, become "sending" elements, at which time, the 'Influence Coefficient Matrix [C]' 37 is fully populated.

As indicated by step 49 in FIG. 17, considering a rectangular 'sending element' [i.e., a 'grid cell' (67a/67b) of FIG. 19] having dimensions (2a)×(2b) located at [x(1), y(iys)] in layer l (step 51 of FIG. 17), the processor 72a now begins to execute step 53 of FIG. 18.

In FIG. 18, when the processor 72a executes step 53 in FIG. 18, the processor 72a will calculate 'benchmark stresses' $\sigma^l_{zz}(x(ixr=1:nelemx),y(iyr=1:nelemy))$ throughout the parent numerical mesh 67 of FIG. 19 by practicing the following steps:

In step 53a, in connection with the 'current sending element' or the 'current grid cell 67a/67b of FIG. 19', solve equation (8) for the 'current sending element' to thereby yield a Fourier Transform (FT) of the 'benchmark stresses', which we represent by the notation $\hat{\sigma}_{zz}^l$, where equation (8) is set forth in greater detail in the 'Detailed Description' of this specification, and is duplicated below, as follows:

$$\begin{bmatrix} 0 \\ \hat{\sigma}_{yx}/k_{yx} \\ \hat{\sigma}_{yz}/k_{yz} \end{bmatrix}^l = \begin{bmatrix} \Delta\hat{u}_y \\ \Delta\hat{u}_x \\ \Delta\hat{u}_z \end{bmatrix}^l \qquad (8)$$

$$= R_{bt}^{l+1} \begin{bmatrix} \hat{\sigma}_{yy} \\ \hat{\sigma}_{yx} \\ \hat{\sigma}_{yz} \end{bmatrix}^{l+1}_t +$$

$$(R_{bb}^{l+1} - R_{tt}^l) \begin{bmatrix} \hat{\sigma}_{yy} \\ \hat{\sigma}_{yx} \\ \hat{\sigma}_{yz} \end{bmatrix}^l_t - R_{tb}^l \begin{bmatrix} \hat{\sigma}_{yy} \\ \hat{\sigma}_{yx} \\ \hat{\sigma}_{yz} \end{bmatrix}^{l-1}_t$$

(2) In step 53b and 53b1, determine the 'low frequency components (LOW)' by subtracting off the 3-layer and 2-interface 'Uniform Asymptotic Solution (UAS)':

$$(\hat{\sigma}_{zz}^l)^{LOW} = \hat{\sigma}_{zz}^l - (\hat{\sigma}_{zz}^l)^{UAS},$$

(3) In step 53c, invert the Uniform Asymptotic Solution (UAS) using equation (5) analytically, where equation (5) is set forth in greater detail in the 'Detailed Description' of this specification and is duplicated below, as follows:

$$T^l(x, y, z) = \frac{1}{(2\pi)^2} \int_{-\infty}^{\infty}\int_{-\infty}^{\infty} e^{-i(mx+nz)} \hat{T}^l(m, n, y) dm dn \qquad (5)$$

(4) In step 53d, invert the low frequency Fourier Transform (FT) components $(\hat{\sigma}_{zz}^l)^{LOW}$ by numerical evaluation of equation (5), which is duplicated again below, as follows:

$$T^l(x, y, z) = \frac{1}{(2\pi)^2} \int_{-\infty}^{\infty}\int_{-\infty}^{\infty} e^{-i(mx+nz)} \hat{T}^l(m, n, y) dm dn \qquad (5)$$

(5) In step 53e, combine the low frequency 'benchmark stresses' and the Uniform Asymptotic Solution (UAS) 'benchmark stresses', as follows:

$$\sigma_{zz}^l = (\sigma_{zz}^l)^{LOW} + (\sigma_{zz}^l)^{UAS}$$

The processor 72a will now store the 'benchmark stresses' associated with the 'current sending element' (i.e., associated with one of the 'rectangularly shaped elements or grid cells' 67a/67b of FIG. 19) in the 'Influence Coefficient Matrix [C]' 37 [i.e., in the Influence Coefficient Matrix 'C(numr,iys)=$\sigma_{zz}^l$(ixr,iyr), where numr=(ixr−1)
*nelemy+iyr'].

Increment the old 'sending element' number (i.e., the old 'rectangularly shaped element or old grid cell' 67a/67b of FIG. 19) iys to produce or generate a new 'sending element' number (iys+1), where the incrementing step is practiced by adding 1 to the old 'sending element' number iys, and repeat steps 49, 51, and 53 of FIGS. 17 and 18 for the next sending element.

After completion of steps 49, 51, and 53 for all sending elements (i.e., all the 'rectangularly shaped elements or grid cells' 67a/67b) in the numerical mesh 67 of FIG. 19, the processor 72a will store the 'Influence Coefficient Matrix [C]' 37 on a storage device for later use by step 92 of the Hydraulic Fracturing Simulator software 80 of FIG. 13.

When execution of step 53 of FIG. 18 is complete, a 'new Influence Coefficient Matrix [C]' 37 will be generated, where the 'new Influence Coefficient Matrix [C]' 37 will now allow the Hydraulic Fracturing Simulator software 80 to model and take into account the existence of 'slip' 27 or 'debonding' 27 between adjacent layers of the reservoir of FIG. 4, such as the 'slip' 27 or 'debonding' 27 which exists between adjacent layers 17e/17f and adjacent layers 17g/17h of the reservoir or Earth formation 17 illustrated in FIG. 4.

Now that a 'new Influence Coefficient Matrix [C]' 37 has been generated by processor 72a, the execution of step 102 illustrated in FIGS. 13 and 15 is now complete; and, as a result, the processor 72a will now begin to execute the remaining steps of 'Hydraulic Fracturing Simulator Software' 80 illustrated in FIGS. 13 and 15 including steps 92, 94, and 96.

In FIG. 13, now that the 'Set Up Influence Coefficient Matrix' step 102 has generated the 'new Influence Coefficient Matrix [C]' 37 as described above which takes into account the 'slip' 27 or 'debonding' 27, the 'time stepping' step 90 will begin incrementing the time steps, beginning with time step $t_1$.

At time step $t_1$, the 'calculate fracture width (w), given fluid pressure (p) (multilayer elasticity)' step 92 of FIG. 13 (called the 'second step 92') will be executed by the processor 72a of the computer system 72 of FIG. 10. The second step 92 of FIG. 13 will calculate the fracture width (w) by using the Elasticity Equation 33 shown in FIG. 14, as follows:

{w}=[C]$^{-1}${p−$\sigma_c$}  (Elasticity Equation 33)

In the Elasticity Equation 33 set forth above, the 'new Influence Coefficient Matrix [C]' 37, which was calculated using FIGS. 17 and 18 as described above, will be used in connection with the Influence Coefficient Matrix [C] 37 of the Elasticity Equation 33. The term $\sigma_c$ is the local confining stress which can vary from one layer to the next. An initial, estimated, value of the fluid pressure (p) will be selected. Therefore, using the 'new Influence Coefficient Matrix [C]' which was calculated using FIGS. 17 and 18 as described above, and using the values of p and $\sigma_c$ previously described, the fracture width (w) will be calculated in second step 92 of FIG. 13 by the processor 72a of the computer system 72 of FIG. 10.

The 'calculate fluid pressure (p) given fracture width (w) (fluid flow)' step 94 of FIG. 13 (called the 'third step 94') will now be executed by the processor 72a. In the third step 94, the fluid pressure (p) will be calculated using the fracture width (w) that was calculated in the second step 92 of FIG. 13, as described above.

As a result, operating within the first time step $t_1$, the second step 92 and the third step 94 will iterate on each other (as indicated by arrow 100) until the fracture width (w) and the fluid pressure (p) are solved at every point in the fracture geometry of FIG. 4. When the iteration 100 of steps 92 and 94 is complete, the fracture footprint is updated in step 96 of FIG. 13. The time step 97 is then incremented to the second time step $t_2$, and, responsive thereto, the second step 92 and the third step 94 will then iterate again on each other (as indicated by arrow 100) until the fracture width (w) and the fluid pressure (p) are solved at every point in the fracture geometry of FIG. 4. When the iteration 100 of steps 92 and 94 is complete, the fracture footprint is updated in step 96. The time step 97 is then incremented once again to the third time step $t_3$, and the second step 92 and the third step 94 will then iterate again on each other (as indicated by arrow 100) until the fracture width (w) and the fluid pressure (p) are solved at every point in the fracture geometry of FIG. 4. When the iteration 100 of steps 92 and 94 is complete, the fracture footprint is updated again in step 96, the time step 97 is then incremented once again, and the above process repeats until 'convergence' is achieved. The aforesaid 'convergence' will be achieved when the difference between the fracture width (w) of step 92 in the current iteration of loop 100 and the fracture width (w) of step 92 in the previous iteration of loop 100 is less than or equal to a small value $\epsilon$, and the difference between the fluid pressure (p) of step 94 in the current iteration of loop 100 and the fluid pressure (p) of step 94 in the previous iteration of loop 100 is less than or equal to a small value $\epsilon$. The Output Data 72c1 of FIG. 13 is generated when the aforementioned 'convergence' is achieved. The Output Data 72c1 may include: the fracture footprint at each time step, fluid pressure (p), and fracture width (w) at each 'element' or 'grid cell' of the fracture footprint.

DETAILED DESCRIPTION

The 'Detailed Description' will now describe in greater detail the invention which is set forth above in the 'Description'.

1. Slip Model

We consider a procedure for modeling hydraulic fracturing in layered reservoirs in which slip is allowed across layer interfaces. A linear relationship is assumed between the shear tractions on each interface and the shear deformation that occurs along each interface.

2. Influence Coefficient Matrix

Since the equations governing the elastic deformation as well as those governing the slip along the interfaces are linear, the principle of superposition applies. Thus, a linear combination of solutions to this system, which may represent various loading situations, is again a solution. It is therefore possible to construct an influence matrix, which represents the stress influences of all possible displacement discontinuity (DD) components that fall within a planar window (i.e., the plane containing the hydraulic fracture), as depicted in FIG. 4.

By considering a fixed mesh of rectangular elements, we can save on computational resources. For example, the influence of element (i,j)=(1, 1) on (8, 6) is identical to the influence of (3, 1) on (10, 6), where i=element number in the x direction, and j=element number in they direction. This "translational invariance" allows us to express all possible influence combinations in terms of the first column of elements (1,j) in the mesh. Thus, less storage is required, and the convolution property associated with translational invariance can be exploited to determine element-to-element influences extremely rapidly by using Fast Fourier transforms (FFTs).

3. Construction of Influence Coefficients Using the Fourier Transform

In order to determine the individual DD influences, we propose a method based on the Fourier transform (FT), which exploits the layered structure of the elastic medium (as discussed in the Peirce and Siebrits references cited elsewhere here). In particular, the standard layer differential equations are given by:

Equilibrium: $\sigma_{ij,j}^l + f_i^l = 0$     (1a)

where $f_i^l$ is a body force term, assumed to be zero in our case, l is the layer number, and subscripts 'i' and 'j' range from 1 to 3 and where notation $\sigma_{ij,j}$ implies the following:

$\sigma_{1j,j} = \sigma_{11,1} + \sigma_{12,2} + \sigma_{13,3}$, $\sigma_{2j,j} = \sigma_{21,1} + \sigma_{22,2} + \sigma_{23,3}$, and $\sigma_{3j,j} = \sigma_{31,1} + \sigma_{32,2} + \sigma_{33,3}$, and $\sigma_{12,2}$, for example, is defined as $$\sigma_{12,2} = \frac{d\sigma_{12}}{dx_2} = \frac{d\sigma_{12}}{dy},$$

where $x_1 \equiv x$, $x_2 \equiv y$, and $x_3 \equiv z$.

Stress-strain: $\sigma_{ij}^l = \lambda^l \epsilon_{kk}^l \delta_{ij} + 2\mu^l \epsilon_{ij}^l$     (1b)

where $\lambda^l$ and $\mu^l$ are the Lame constants, $\delta_{ij}$ is the Kronecker delta function, and where l is the layer or layer interface number (assigned such that the layer number matches the layer interface number of the interface at the bottom of each layer).

Strain-displacement: $\epsilon_{ij}^l = (u_{i,j}^l + u_{j,i}^l)/2$     (1c)

where $u_{1,3}$, for example, is defined as $$u_{1,3} = \frac{du_1}{dx_3} = \frac{du_1}{dz}$$

Combining the above, we can write:

$\partial_y T^l = K^l T^l + b^l$     (2a)

where $T^l = (\sigma_{yy}^l, \sigma_{yx}^l, \sigma_{yz}^l, u_y^l, u_x^l, u_z^l)$, $K^l$ is a differential operator, and superscript T denotes the mathematical transpose operator. In (2a), $b^l$ is a body forcing term that is zero in our case.

Define the 2D FT of a function $g(x, z)$ to be $$\hat{g}(m, n) = \int_{-\infty}^{\infty} \int_{-\infty}^{\infty} e^{i(mx+nz)} g(x, z) dx dz$$

where 'e' is the exponential operator, and 'i' is the imaginary number.

Taking the FT of (2a) we obtain $\partial_y \hat{T}^l = \hat{K}^l(k) \hat{T}^l + \hat{b}^l$     (2b)

which is parameterized by the 2D wave number $k = \sqrt{m^2 + n^2}$. In (2b), the transformed body forcing term $\hat{b}^l$ is zero.

The solution to the system of ordinary differential equations (2b) can be written in the form $$\hat{T}^l(k, y) = Z^l(k, y) A^l(k) \qquad (3)$$

where $Z^l(k, y)$ is a 6 by 6 matrix that depends on the elastic constants of the layer in which the solution is desired, the wave-number k, and y, which determines the horizon in a particular layer at which the solution is required, and is defined by equation (3.5) in the following reference: A. P. Peirce, and E. Siebrits, "Uniform Asymptotic Approximations for Accurate Modeling of Cracks in Layered Elastic Media", International Journal of Fracture, 110, 205-239, 2001. $A^l(k,y)$ is a 6 by 1 column vector of integration constants parameterized by k.

The coefficients $A^l(k)$ for each of the layers is determined by separating the stress and displacement components in $\hat{T}^l$ as follows:

$$\hat{T}^l = (p^l, u^l)^T \qquad (3a)$$

where $p^l = (\hat{\sigma}_{yy}^l, \hat{\sigma}_{yx}^l, \hat{\sigma}_{yz}^l)$ and $u^l = (\hat{u}_y^l, \hat{u}_x^l, \hat{u}_z^l)$. We then consider the $p^l$ and $u^l$ vectors at the top of $(p_t^l$ and $u_t^l)$ and the bottom of $(p_b^l$ and $u_b^l)$ each elastic layer, and eliminate the coefficients $A^l(k)$ to obtain the following block tri-diagonal system that relates the $p_t^l$ vectors to the discontinuities in the displacements across any interface l:

$$\Delta u^l = u_b^{l+1} - u_t^l = R_{bt}^{l+1} p_t^{l+1} + (R_{bb}^{l+1} - R_{tt}^l) p_t^l - R_{tb}^l p_t^{l+1} + R_{bb}^{l+1} \Delta p^l - R_{tb}^l \Delta p^{l-1} \qquad (4)$$

where the R terms are defined by (3.14) to (3.18) in the following reference: A. P. Peirce, and E. Siebrits, "Uniform Asymptotic Approximations for Accurate Modeling of Cracks in Layered Elastic Media", International Journal of Fracture, 110, 205-239, 2001, the disclosure of which is incorporated by reference into this application.

Once the solution to the system (4) has been determined for the required wave-numbers, the undetermined coefficients $A^l(k)$ for each layer can be calculated using equation (3).

Once the $A^l(k)$ have been calculated, the stresses and displacements at any horizon y can be determined using equation (3). The stress and displacement components in (x, y, z) space can then be obtained from the inversion formula:

$$T^l(x, y, z) = \frac{1}{(2\pi)^2} \int_{-\infty}^{\infty} \int_{-\infty}^{\infty} e^{-i(mx+nz)} \hat{T}^l(m, n, y) dm dn \qquad (5)$$

4. Slip Interface Conditions

In order to implement the appropriate slip conditions along each interface, we consider the two sides of the interface to be connected by two springs that control the relative shear motion between the interface sides. The linear relationship between the shear stresses and the shear displacements can be written as:

$$\sigma_{yx}^l = k_{yx}(u_x^{l+1} - u_x^l)|_{y \to y^l}$$

$$\sigma_{yz}^l = k_{yz}(u_z^{l+1} - u_z^l)|_{y \to y^l} \qquad (6a)$$

In order to maintain equilibrium, we require that the following stress components be continuous across the interface:

$$\lim_{y \to y^l} \sigma_{yy}^{l+1} = \lim_{y \to y^l} \sigma_{yy}^l \text{ or } \Delta \sigma_{yy}^l = 0 \qquad (6b)$$

-continued $$\lim_{y \to y^l} \sigma_{yx}^{l+1} = \lim_{y \to y^l} \sigma_{yx}^l \text{ or } \Delta \sigma_{yx}^l = 0$$

$$\lim_{y \to y^l} \sigma_{yz}^{l+1} = \lim_{y \to y^l} \sigma_{yz}^l \text{ or } \Delta \sigma_{yz}^l = 0$$

Finally, we assume that the interfaces are in contact so that $$\lim_{y \to y^l} u_y^{l+1} = \lim_{y \to y^l} u_y^l \text{ or } \Delta u_y^l = 0 \qquad (6c)$$

In summary, the 6 interface conditions (necessary to determine the 6 free constants in each layer) are given by:

$$\Delta \sigma_{yy}^l = 0$$

$$\Delta \sigma_{yx}^l = 0$$

$$\Delta \sigma_{yz}^l = 0$$

$$\sigma_{yx}^l = k_{yx} \Delta u_x^l$$

$$\sigma_{yz}^l = k_{yz} \Delta u_y^l$$

$$\Delta u_y^l = 0 \qquad (7)$$

We observe that, when implementing the interface conditions, (7) needs to be combined with (4) as follows:

$$\begin{bmatrix} 0 \\ \hat{\sigma}_{yx}/k_{yx} \\ \hat{\sigma}_{yz}/k_{yz} \end{bmatrix}^l = \qquad (8)$$

$$\begin{bmatrix} \Delta \hat{u}_y \\ \Delta \hat{u}_x \\ \Delta \hat{u}_z \end{bmatrix}^l = R_{bt}^{l+1} \begin{bmatrix} \hat{\sigma}_{yy} \\ \hat{\sigma}_{yx} \\ \hat{\sigma}_{yz} \end{bmatrix}_t^{l+1} + (R_{bb}^{l+1} - R_{tt}^l) \begin{bmatrix} \hat{\sigma}_{yy} \\ \hat{\sigma}_{yx} \\ \hat{\sigma}_{yz} \end{bmatrix}_t^l - R_{tb}^l \begin{bmatrix} \hat{\sigma}_{yy} \\ \hat{\sigma}_{yx} \\ \hat{\sigma}_{yz} \end{bmatrix}_t^{l-1}$$

or $$0 = R_{bt}^{l+1} p_t^{l+1} + \left( R_{bb}^{l+1} - R_{tt}^l - \begin{bmatrix} 0 & 0 & 0 \\ 0 & 1/k_{yx} & 0 \\ 0 & 0 & 1/k_{yz} \end{bmatrix} \right)^l p_t^l - R_{tb}^l p_t^l$$

Note that, since the stress components in (7) are continuous across the interface, the terms $\Delta p^l$ and $\Delta p^{l-1}$ in equation (4) have vanished.

The following prior art references (1), (2), and (3) are incorporated by reference into the specification of this application:

(1) "Some Applications of the Frictionless Laminated Model", Rock Mechanics as a Guide for Efficient Utilization of Natural Resources, Khair (ed.), copyright 1989, Balkema, Rotterdam, ISBN 90 6191 871 5;

(2) "Subsidence Prediction Using a Laminated Linear Model", Rock Mechanics as a Guide for Efficient Utilization of Natural Resources, Khair (ed.), copyright 1989, Balkema, Rotterdam, ISBN 90 6191 871 5; and (3) "Backward Transfer-Matrix Method for Elastic Analysis of Layered Solids with Imperfect Bonding", Journal of Elasticity, 50: 109-128, 1998, copyright 1998 Kluwer Academic Publishers The above description of the 'Hydraulic Fracturing Simulator software' being thus described, it will be obvious that the same may be varied in many ways. Such variations are not to be regarded as a departure from the spirit and scope of the claimed method or apparatus or program storage device, and all such modifications as would be obvious to one skilled in the art are intended to be included within the scope of the following claims.

We claim:

1. A method of simulating a hydraulic fracture in a formation having a plurality of layers where a slip zone exists between at least one adjacent pair of said layers, comprising:
   (a) setting up an influence coefficient matrix on the condition that said slip zone exists between at least one adjacent pair of said layers, the calculation of said matrix taking into account an existence of said slip zone;
   (b) simulating a fracture width at a first time step using said influence coefficient matrix;
   (c) simulating a fluid pressure at said first time step using said fracture width; and
   simulating a fracture footprint in response to the simulating step (c).

2. The method of claim 1, wherein a numerical mesh includes a plurality of sending elements, and wherein the calculating step (a), for calculating said influence coefficient matrix on the condition that said slip zone exists between at least one adjacent pair of said layers comprises the steps of:
   (a1) looping through each sending element of said plurality of sending elements in said mesh;
   (a2) calculating benchmark stresses associated with each sending element of said plurality of sending elements in said mesh;
   (a3) storing said benchmark stresses associated with each sending element of said plurality of sending elements in said influence coefficient matrix; and
   (a4) repeating steps (a2) and (a3) associated with each sending element of said plurality of sending elements in said numerical mesh.

3. The method of claim 2, wherein said calculating step (a2) comprises the steps of:
   (a21) generating a Fourier Transform for each sending element of said plurality of sending elements in said mesh; and
   (a22) determining a set of low frequency components of said Fourier Transform for each sending element.

4. The method of claim 3, wherein the determining step (a22) comprises the step of:
   determining the set of low frequency components by subtracting off a three-layer and a two-interface uniform asymptotic solution (UAS).

5. The method of claim 4, wherein the determining step (a22) further comprises the step of:
   determining the set of low frequency components by subtracting off a three-layer and a two-interface uniform asymptotic solution (UAS) using the following equation:
   $$(\hat{\sigma}_{zz}^l)^{LOW} = \hat{\sigma}_{zz}^l - (\hat{\sigma}_{zz}^l)^{UAS},$$
   wherein l comprises a layer number, $(\hat{\sigma}_{zz}^l)^{LOW}$ comprises a low frequency benchmark stress, $(\hat{\sigma}_{zz}^l)^{UAS}$ comprises a UAS benchmark stress, and $\hat{\sigma}_{zz}^l$ comprises a benchmark stress.

6. The method of claim 4, wherein said calculating step (a2) further comprises the step of:
   inverting the UAS solution $(\hat{\sigma}_{zz}^l)^{UAS}$, wherein l comprises a layer number and $(\hat{\sigma}_{zz}^l)^{UAS}$, comprises a UAS benchmark stress.

7. The method of claim 6, wherein said calculating step (a2) further comprises the step of:
   inverting the UAS solution $(\hat{\sigma}_{zz}^l)^{UAS}$ using the following equation analytically:
   $$T^l(x, y, z) = \frac{1}{(2\pi)^2} \int_{-\infty}^{0} \int_{-\infty}^{0} e^{-i(mx+nz)} \hat{T}^l(m, n, y) dm dn,$$
   wherein l comprises a layer number, wherein T comprises a stress and displacement matrix, wherein $\hat{T}$ comprises a Fourier transform of the stress and displacement matrix, wherein m and n comprise Fourier wave number components, and wherein x, y, and z comprise spatial coefficients.

8. The method of claim 6, wherein said calculating step (a2) further comprises the step of:
   inverting the low frequency components of said Fourier Transform $(\hat{\sigma}_{zz}^l)^{LOW}$, wherein $(\hat{\sigma}_{zz}^l)^{LOW}$ comprises a low frequency benchmark stress.

9. The method of claim 8, wherein said calculating step (a2) further comprises the step of:
   inverting the low frequency components of said Fourier Transform $(\hat{\sigma}_{zz}^l)^{LOW}$ by numerical evaluation of the following equation:
   $$T^l(x, y, z) = \frac{1}{(2\pi)^2} \int_{-\infty}^{0} \int_{-\infty}^{0} e^{-i(mx+nz)} \hat{T}^l(m, n, y) dm dn,$$
   wherein l comprises a layer number, wherein T comprises a stress and displacement matrix, wherein $\hat{T}$ comprises a Fourier transform of the stress and displacement matrix, wherein m and n comprise Fourier wave number components, and wherein x, y, and z comprise spatial coefficients.

10. The method of claim 8, wherein said calculating step (a2) further comprises the step of:
    combining a set of low frequency stresses and a set of UAS stresses.

11. The method of claim 10, wherein said calculating step (a2) further comprises the step of:
    combining a set of low frequency stresses and a set of UAS stresses using the following equation: $\sigma_{zz}^l = (\sigma_{zz}^l)^{LOW} + (\sigma_{zz}^l)^{UAS}$ wherein l comprises a layer number, $(\hat{\sigma}_{zz}^l)^{LOW}$ comprises a low frequency benchmark stress, $(\hat{\sigma}_{zz}^l)^{UAS}$ comprises a UAS benchmark stress, and $\hat{\sigma}_{zz}^l$ comprises a benchmark stress.

12. A program storage device readable by a machine tangibly embodying a program of instructions executable by the machine to perform method steps for simulating a hydraulic fracture in a formation having a plurality of layers where a slip zone exists between at least one adjacent pair of said layers, said method steps comprising:
    (a) setting up an influence coefficient matrix on the condition that said slip zone exists between at least one adjacent pair of said layers, the calculation of said matrix taking into account an existence of said slip zone;
    (b) simulating a fracture width at a first time step using said influence coefficient matrix;
    (c) simulating a fluid pressure at said first time step using said fracture width; and
    (d) simulating a fracture footprint in response to the simulation step (c).

13. The program storage device of claim 12, wherein a numerical mesh includes a plurality of sending elements, and wherein the calculating step (a), for calculating said influence coefficient matrix on the condition that said slip zone exists between at least one adjacent pair of said layers comprises the steps of:
- (a1) looping through each sending element of said plurality of sending elements in said mesh;
- (a2) calculating benchmark stresses associated with each sending element of said plurality of sending elements in said mesh;
- (a3) storing said benchmark stresses associated with each sending element of said plurality of sending elements in said influence coefficient matrix; and
- (a4) repeating steps (a2) and (a3) associated with each sending element of said plurality of sending elements in said numerical mesh.

14. The program storage device of claim 13, wherein said calculating step (a2) comprises the steps of:
- (a21) generating a Fourier Transform for each sending element of said plurality of sending elements in said mesh; and
- (a22) determining a set of low frequency components of said Fourier Transform for each sending element.

15. The program storage device of claim 14, wherein the determining step (a22) comprises the step of:
determining the set of low frequency components by subtracting off a three-layer and a two-interface uniform asymptotic solution (UAS).

16. The program storage device of claim 15, wherein the determining step (a22) further comprises the step of:
determining the set of low frequency components by subtracting off a three-layer and a two-interface uniform asymptotic solution (UAS) using the following equation: $(\hat{\sigma}_{zz}^l)^{LOW} = \hat{\sigma}_{zz}^l - (\hat{\sigma}_{zz}^l)^{UAS}$ wherein l comprises a layer number, $(\hat{\sigma}_{zz}^l)^{LOW}$ comprises a low frequency benchmark stress, $(\hat{\sigma}_{zz}^l)^{UAS}$ comprises a UAS benchmark stress, and $\hat{\sigma}_{zz}^l$ comprises a benchmark stress.

17. The program storage device of claim 15, wherein said calculating step (a2) further comprises the step of:
inverting the UAS solution $(\hat{\sigma}_{zz}^l)^{UAS}$, wherein l comprises a layer number and $(\hat{\sigma}_{zz}^l)^{UAS}$ comprises a UAS benchmark stress.

18. The program storage device of claim 17, wherein said calculating step (a2) further comprises the step of:
inverting the UAS solution $(\hat{\sigma}_{zz}^l)^{UAS}$ using the following equation analytically:

$$T^l(x, y, z) = \frac{1}{(2\pi)^2} \int_{-\infty}^0 \int_{-\infty}^0 e^{-i(mx+nz)} \hat{T}^l(m, n, y) dm dn,$$

wherein l comprises a layer number, wherein T comprises a stress and displacement matrix, wherein $\hat{T}$ comprises a Fourier transform of the stress and displacement matrix, wherein m and n comprise Fourier wave number components, and wherein x, y, and z comprise spatial coefficients.

19. The program storage device of claim 17, wherein said calculating step (a2) further comprises the step of:
inverting the low frequency components of said Fourier Transform $(\hat{\sigma}_{zz}^l)^{LOW}$, wherein $(\hat{\sigma}_{zz}^l)^{LOW}$ comprises a low frequency benchmark stress.

20. The program storage device of claim 19, wherein said calculating step (a2) further comprises the step of:
inverting the low frequency components of said Fourier Transform $(\hat{\sigma}_{zz}^l)^{LOW}$ by numerical evaluation of the following equation:

$$T^l(x, y, z) = \frac{1}{(2\pi)^2} \int_{-\infty}^0 \int_{-\infty}^0 e^{-i(mx+nz)} \hat{T}^l(m, n, y) dm dn,$$

wherein l comprises a layer number, wherein T comprises a stress and displacement matrix, wherein $\hat{T}$ comprises a Fourier transform of the stress and displacement matrix, wherein m and n comprise Fourier wave number components, and wherein x, y, and z comprise spatial coefficients.

21. The program storage device of claim 19, wherein said calculating step (a2) further comprises the step of:
combining a set of low frequency stresses and a set of UAS stresses.

22. The program storage device of claim 21, wherein said calculating step (a2) further comprises the step of:
combining a set of low frequency stresses and a set of UAS stresses using the following equation: $\sigma_{zz}^l = (\sigma_{zz}^l)^{LOW} + (\sigma_{zz}^l)^{UAS}$, wherein l comprises a layer number, $(\hat{\sigma}_{zz}^l)^{LOW}$ comprises a low frequency benchmark stress, $(\hat{\sigma}_{zz}^l)^{UAS}$ comprises a UAS benchmark stress, and $\hat{\sigma}_{zz}^l$ comprises a benchmark stress.

23. A method of simulating a hydraulic fracture in an Earth formation where the formation includes a multilayered reservoir comprised of a plurality of layers, a slip existing between at least one adjacent pair of layers of said multilayered reservoir, comprising the step of:
(a) setting up an influence coefficient matrix, the matrix having a plurality of numbers, said plurality of numbers of said influence coefficient matrix being calculated and determined such that said method for simulating said hydraulic fracture takes into account an existence of said slip between said at least one adjacent pair of said layers of said multilayered reservoir; (b) simulating a fracture width at a first time step using said influence coefficient matrix; (c) simulating a fluid pressure at said first time step using said fracture width; and (d) simulating a fracture footprint in response to the simulating of a fracture width and a fluid pressure.

24. The method of claim 23, wherein the setting up step (a) of setting up an influence coefficient matrix comprises the steps of:
- (a1) determining a Fourier Transform of a set of interface stresses-displacement vectors in connection with a current sending element; and
- (a2) determining a set of layer spectral coefficients.

25. The method of claim 24, wherein the setting up step (a) further comprises the steps of:
- (a3) determining a set of normal stress components in a fracture plane; and
- (a4) determining a Uniform Asymptotic Solution (UAS) that contains high frequency components.

26. The method of claim 25, wherein the setting up step (a) further comprises the steps of:
- (a5) determining a set of low frequency components; and
- (a6) inverting the UAS Solution analytically.

27. The method of claim 26, wherein the setting up step (a) further comprises the steps of:
- (a7) inverting the low frequency Fourier Transform components numerically; and
- (a8) combining a set of low frequency stresses and a set of UAS stresses to obtain a set of stresses due to the current sending element.

28. The method of claim 27, wherein a mesh overlays said fracture thereby defining a plurality of elements, the method further comprising the steps of:
- (b) setting a time step to be a first time step;
- (c) in said first time step, iteratively calculating a fracture width in each element given a fluid pressure in said each element and iteratively calculating a fluid pressure in each element given a fracture width in each element until convergence occurs;
- (d) updating a fracture footprint in response to the calculating step (c);
- (e) updating the time step to a second time step;
- (f) repeating steps (c), (d), and (e) until a limitation is reached; and
- (g) generating output data representing a fracture width and a fluid pressure in each element of said plurality of elements of said mesh.

29. A program storage device readable by a machine tangibly embodying a program of instructions executable by the machine to perform method steps for simulating a hydraulic fracture in an Earth formation where the formation includes a multilayered reservoir comprised of a plurality of layers, a slip existing between at least one adjacent pair of layers of said multilayered reservoir, said method steps comprising:
- (a) setting up an influence coefficient matrix, the matrix having a plurality of numbers, said plurality of numbers of said influence coefficient matrix being calculated and determined such that said method for simulating said hydraulic fracture takes into account an existence of said slip between said at least one adjacent pair of said layers of said multilayer reservoir; (b) simulating a fracture width at a first time step using said influence coefficient matrix; (c) simulating a fluid pressure at said first time step using said fracture width;
- and (d) simulating a fracture footprint in response to the simulating of a fracture width and a fluid pressure.

30. The program storage device of claim 29, wherein the setting up step (a) of setting up an influence coefficient matrix comprises the steps of:
- (a1) determining a Fourier Transform of a set of interface stresses-displacement vectors in connection with a current sending element; and
- (a2) determining a set of layer spectral coefficients.

31. The program storage device of claim 30, wherein the setting up step (a) further comprises the steps of:
- (a3) determining a normal stress components in a fracture plane; and
- (a4) determining a Uniform Asymptotic Solution (UAS) that contains high frequency components.

32. The program storage device of claim 31, wherein the setting up step (a) further comprises the steps of:
- (a5) determining a set of low frequency components; and
- (a6) inverting the UAS Solution analytically.

33. The program storage device of claim 32, wherein the setting step (a) further comprises the steps of:
- (a7) inverting the low frequency Fourier Transform components numerically; and
- (a8) combining a set of low frequency stresses and a set of UAS stresses to obtain a set of stresses due to the current sending element.

34. The program storage device of claim 33, wherein a mesh overlays said fracture thereby defining a plurality of elements, the method further comprising the steps of:
- (b) setting a time step to be a first time step;
- (c) in said first time step, iteratively calculating a fracture width in each element given a fluid pressure in said each element and iteratively calculating a fluid pressure in each element given a fracture width in each element until convergence occurs;
- (d) updating a fracture footprint in response to the calculating step (c);
- (e) updating the time step to a second time step;
- (f) repeating steps (c), (d), and (e) until a limitation is reached; and
- (g) generating output data representing a fracture width and a fluid pressure in each element of said plurality of elements of said mesh.

* * * * *